(12) United States Patent
Kang et al.

(10) Patent No.: US 8,841,754 B2
(45) Date of Patent: Sep. 23, 2014

(54) SEMICONDUCTOR DEVICES WITH STRESS RELIEF LAYERS

(71) Applicant: Samsung Electronics Co., Ltd., Suwon-si (KR)

(72) Inventors: Sin-Woo Kang, Suwon-si (KR);
Jang-Ho Kim, Incheon (KR);
Woon-Seob Lee, Suwon-si (KR);
Jong-Hoon Cho, Seoul (KR);
Sung-Dong Cho, Hwaseong-si (KR);
Yeong-Lyeol Park, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/763,309

(22) Filed: Feb. 8, 2013

(65) Prior Publication Data
US 2013/0249045 A1 Sep. 26, 2013

(30) Foreign Application Priority Data
Mar. 22, 2012 (KR) .................. 10-2012-0029498

(51) Int. Cl.
*H01L 29/40* (2006.01)
*H01L 23/48* (2006.01)
*H01L 21/768* (2006.01)

(52) U.S. Cl.
CPC ..... *H01L 23/481* (2013.01); *H01L 2224/05572* (2013.01); *H01L 2224/04042* (2013.01); *H01L 2224/16227* (2013.01); *H01L 2224/0401* (2013.01); *H01L 2224/16145* (2013.01); *H01L 2224/14181* (2013.01); *H01L 21/76877* (2013.01)
USPC ........... 257/621; 257/499; 257/503; 257/506; 257/774

(58) Field of Classification Search
USPC .......................... 257/499, 503, 506, 621, 774
See application file for complete search history.

(56) References Cited

U.S. PATENT DOCUMENTS

| | | | |
|---|---|---|---|
| 7,564,115 B2 | 7/2009 | Chen et al. | |
| 7,799,678 B2 | 9/2010 | Kropewnicki et al. | |
| 7,960,282 B2 | 6/2011 | Yelehanka et al. | |
| 2005/0139954 A1 | 6/2005 | Pyo | |
| 2008/0283959 A1 | 11/2008 | Chen et al. | |
| 2009/0191708 A1 | 7/2009 | Kropewnicki et al. | |
| 2009/0269905 A1 | 10/2009 | Chen et al. | |
| 2009/0289324 A1 | 11/2009 | Goodlin et al. | |
| 2010/0032764 A1 | 2/2010 | Andry et al. | |
| 2010/0129981 A1 | 5/2010 | Smith | |
| 2010/0224876 A1 | 9/2010 | Zhu | |
| 2010/0224965 A1 | 9/2010 | Kuo | |
| 2010/0297844 A1* | 11/2010 | Yelehanka et al. ............ 438/667 |
| 2011/0089572 A1 | 4/2011 | Tezcan et al. | |
| 2011/0198721 A1 | 8/2011 | Yang et al. | |

FOREIGN PATENT DOCUMENTS

KR    1020050070527 A    7/2005

OTHER PUBLICATIONS

US 2006/0094163, 05/2006, Erturk et al. (withdrawn).

* cited by examiner

*Primary Examiner* — Thanh V Pham
(74) *Attorney, Agent, or Firm* — Myers Bigel Sibley & Sajovec, P.A.

(57) ABSTRACT

A semiconductor device having a via structure in a stress relief layer is provided. The semiconductor device may include an isolation layer on the circuit region, a stress relief layer on the via region, and a via structure in the stress relief layer and the substrate. The stress relief layer may have a thickness larger than that of the isolation layer and a stepped cross section.

16 Claims, 21 Drawing Sheets

SEMICONDUCTOR DEVICES WITH STRESS RELIEF LAYERS

CROSS-REFERENCE TO RELATED APPLICATION

This U.S. non-provisional patent application claims priority under 35 U.S.C. §119 to Korean Patent Application No. 10-2012-0029498, filed on Mar. 22, 2012, in the Korean Intellectual Property Office (KIPO), the disclosure of which is hereby incorporated in its entirety.

BACKGROUND

1. Field of the Invention

The present disclosure generally relates to the field of electronics, and more particular to a semiconductor device.

2. Description of the Related Art

According as semiconductor devices have been highly integrated, three-dimensional packaging technologies for stacking chips have been developed. A through silicon via (TSV) technology is a packaging technology in which a via hole is formed through a silicon substrate and a via structure is formed therein.

Where a semiconductor device includes a TSV, the silicon substrate and other devices on the silicon substrate may be stressed during subsequent heat treatment processes since the via structure may have a coefficient of thermal expansion different from that of the silicon substrate and the reliability of the semiconductor device may deteriorate.

In addition, where the via structure includes a barrier layer pattern and a metal layer pattern, the stress due to the difference of the coefficients of thermal expansion may cause the barrier layer pattern to separate from the metal layer pattern.

SUMMARY

A semiconductor device may include a substrate including a circuit region and a via region. The semiconductor device may further include an isolation layer on the circuit region of the substrate and the isolation layer may define an active region. The semiconductor device may also include a stress relief layer on the via region of the substrate and the stress relief layer may have a thickness larger than that of the isolation layer and a stepped cross section. Additionally, the semiconductor device may include a via structure in the stress relief layer and the substrate and the via structure in the substrate may have a portion exposed by the stress relief layer.

In various embodiments, the stress relief layer may comprise a material identical to that comprising the isolation layer and may have a thickness about two times or more than two times larger than that of the isolation layer.

According to various embodiments, the via structure may include an upper portion surrounded by the stress relief layer and the upper potion may have a width gradually decreasing with a depth of the via structure in the substrate. Additionally, the via structure may include a lower portion surrounded by the substrate and the lower potion may have a constant width.

In various embodiments, the semiconductor device may further include a circuit device on the circuit region of the substrate and an insulating interlayer on the circuit device, the isolation layer and the stress relief layer.

According to various embodiments, wherein a portion of the via structure may be in the insulating interlayer In various embodiments, the via structure may include an upper portion surrounded by the insulating interlayer and the stress relief layer, and the upper portion may have a width that gradually decreases with a depth of the via structure. Additionally the via structure may include a lower portion surrounded by the substrate and the lower portion may have a constant width.

According to various embodiments, the via structure may be formed in a recess and may include an insulation layer pattern on an inner wall of the recess. The via structure may further include a barrier layer pattern on the insulation layer pattern. The via structure may also include a metal layer pattern on the barrier layer pattern and the metal layer pattern may fill a remaining portion of the recess.

In various embodiments, the via structure may be formed in an opening and may include an insulation layer pattern on a sidewall of the opening. The via structure may further include a barrier layer pattern on a bottom of the opening exposed to outside of the substrate and on the insulation layer pattern. The via structure may also include a metal layer pattern on the barrier layer pattern and the metal layer pattern may fill a remaining portion of the opening.

According to various embodiments, the stress relief layer may have a width that decreases with a depth of the stress relief layer in the substrate.

A method of manufacturing a semiconductor device may include forming a first trench structure and a second trench structure on a circuit region and a via region of a substrate, respectively. The second trench structure may have a depth larger than that of the first trench structure and may have a stepped cross section. The method may further include forming an isolation layer and a stress relief layer filling the first trench structure and the second trench structure, respectively. The method may also include forming a via structure in the stress relief layer and the substrate, and the via structure in the substrate may have a portion exposed by the stress relief layer.

In various embodiments, forming the first trench structure and the second trench structure may include forming the first trench structure and a second trench on the circuit region and the via region of the substrate, respectively, and the first trench structure and the second trench may have identical depths. Additionally, forming the first trench structure and the second trench structure may include forming a third trench in the second trench to form the second trench structure and the third trench may have a width less than that of the second trench.

According to various embodiments, forming the first trench structure and the second trench structure may include forming the first trench structure on the circuit region of the substrate with a first mask pattern. Furthermore, forming the first trench structure and the second trench structure may also include forming the second trench structure on the via region of the substrate with a second mask pattern that is different from the first mask pattern.

In various embodiments, forming the isolation layer and the stress relief layer may include forming a preliminary isolation layer on the substrate and the preliminary isolation layer may fill the first trench structure and the second trench structure. Additionally, forming the isolation layer and the stress relief layer may include removing portions of the preliminary isolation layer to expose an upper surface of the substrate and to form the isolation layer and the stress relief layer.

A semiconductor device may include a substrate including a circuit region and a via region. The semiconductor device may further include an isolation layer defining an active region on the circuit region. The semiconductor device may also include a stress relief layer on the via region. The stress relief layer may have a thickness greater than that of the isolation layer and may have stair stepped sidewalls having at least two steps. A cross section of the stress relief layer may have a width that decreases from an upper surface of the substrate. Moreover, the semiconductor device may include a via structure in the stress relief layer and the substrate.

In various embodiments, the via structure in the substrate may have a portion exposed by the stress relief layer.

According to various embodiments, the via structure may have a tapered profile in the stress relief layer.

In various embodiments, the via structure may have straight sidewalls having a vertical profile in which the via structure in the substrate is exposed by the stress relief layer.

According to various embodiments, a maximum width cross section of the stress relief layer may have a thickness identical to that of the isolation layer.

In various embodiments, the semiconductor device may further include a circuit device on the circuit region. The semiconductor device may also include an insulating interlayer on the circuit device, the isolation layer and the stress relief layer, and a portion of the via structure may be in the insulating interlayer.

According to various embodiments, a portion of the via structure in the stress relief layer and the insulating interlayer may have a tapered profile with a top portion having a greater width than a lower portion.

BRIEF DESCRIPTION OF THE DRAWINGS

Various embodiments will be more clearly understood from the following detailed description taken in conjunction with the accompanying drawings.

DESCRIPTION OF EMBODIMENTS

Figure 1:
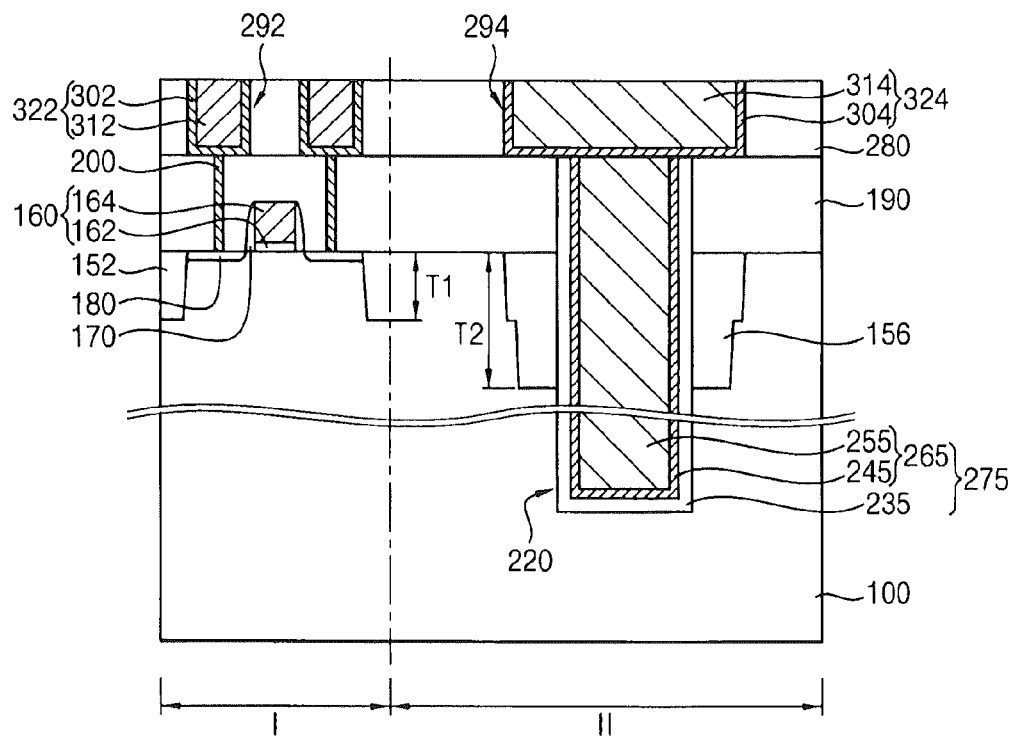
FIG. 1 is a cross-sectional view illustrating a semiconductor device in accordance with various embodiments.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, integers, steps, operations, elements, and/or components, but do not preclude the presence or addition of one or more other features, integers, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present embodiments.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

FIG. 1 is a cross-sectional view illustrating a semiconductor device in accordance with various embodiments.

Referring to FIG. 1, the semiconductor device may include an isolation layer 152 on a first substrate 100, a first stress relief layer 156 and a first via structure 275. The semiconductor device may further include circuit devices and wirings 322 and 324.

The first substrate 100 may be a silicon substrate, a germanium substrate, a silicon-germanium substrate, a silicon-on-insulator (SOI) substrate, a germanium-on-insulator (GOI) substrate, etc.

The first substrate 100 may include a first region I and a second region II. The first region I may be a circuit region in which circuit devices may be formed, and the second region II may be a via region in which a first via structure 275 may be formed. The first region I may include a cell region in which memory cells may be formed and a peripheral circuit region in which peripheral circuit pattern may be formed.

The isolation layer 152 may be formed on the first region I of the first substrate 100, and thus the first substrate 100 may be divided into a field region in which the isolation layer 152 is formed and an active region in which the isolation layer 152 is not formed.

The isolation layer 152 may include an oxide. For example, the isolation layer 152 may include an oxide having good gap filling characteristics such as tonen silazene (TOSZ), flowable oxide (FOX), spin on glass (SOG), etc. In an example embodiment, the isolation layer 152 may have a multi-layered structure having an oxide layer and a nitride layer sequentially stacked.

The first stress relief layer 156 may be formed on the second region II of the first substrate 100.

The first stress relief layer 156 may have a thickness greater than that of the isolation layer 152. In various embodiments, the first stress relief layer 156 may have a second thickness T2 that is equal to or more than about 1.1 times, preferably, about 2 times larger than a first thickness T1 of the isolation layer 152. The isolation layer 152 and the first stress relief layer 156 may have a top surface coplanar with a top surface of the first substrate 100 in which neither the isolation layer 152 nor the first stress relief layer 156 is formed. The first stress relief layer 156 may have a thickness larger than that of the isolation layer 152, and thus the first stress relief layer 156 may have a depth greater than that of the isolation layer 152 along a direction toward an inside of the first substrate 100, e.g., along a vertical direction. The first stress relief layer 156 may have a width greater than that of the isolation layer 152.

In various embodiments, the first stress relief layer 156 may have a width that may decrease from a top portion to a bottom portion thereof, e.g., along the direction toward the inside of the first substrate 100. A maximum width cross section of the first stress relief layer 156 may have a thickness identical to that of the isolation layer 152. In FIG. 1, the first stress relief layer 156 has two steps, however, the first stress relief layer 156 may have more than 2 steps.

In various embodiments, a plurality of first stress relief layers 156 may be formed.

The first stress relief layer 156 may include an oxide or a nitride. In various embodiments, the first stress relief layer 156 may include a material the same as that of the isolation layer 152.

In FIG. 1, a transistor is shown as the circuit device. That is, the transistor including a gate structure 160 on the first region I of the first substrate 100 and impurity regions 180 at upper portions of the first substrate 100 adjacent to the gate structure 160 is shown.

The gate structure 160 may include a gate insulation layer pattern 162 and a gate electrode 164 sequentially stacked on the first substrate 100. A gate spacer 170 may be formed on a sidewall of the gate structure 160. The impurity regions 180 may be doped with n-type impurities, e.g., phosphorus, arsenic, etc., or p-type impurities, e.g., boron, aluminum, etc.

The transistor is an exemplary device, and thus other devices, e.g., diodes, word lines, bit lines, etc. may be formed in the first region I.

A first insulating interlayer 190 covering the transistor may be formed on the first substrate 100, the isolation layer 152 and the first stress relief layer 156. In various embodiments, the first insulating interlayer 190 may include an oxide, e.g., boro phospho silicate glass (BPSG), undoped silicate glass (USG), spin on glass (SOG), etc. In an example embodiment, the first insulating interlayer 190 may have a multi-layered structure, and thus the first via structure 275 may penetrate the first insulating interlayer 190 having the multi-layered structure.

The first via structure 275 may be formed through the first stress relief layer 156 and at least a portion of the first substrate 100 in the second region II. The first via structure 275 in the first substrate 100 may have a portion exposed by the first stress relief layer 156. Further, the first via structure 275 may be formed through the first insulating interlayer 190. A plurality of first stress relief layers 156 and a plurality of first via structures 275 may be formed. In various embodiments, the first via structure 275 may have a sidewall perpendicular to a top surface of the first substrate 100.

In various embodiments, the first via structure 275 may have a first insulation layer pattern 235, a first barrier layer pattern 245 and a first metal layer pattern 255 sequentially stacked. The first metal layer pattern 255 and the first barrier layer pattern 245 may be referred to as a first via electrode 265.

Particularly, the first insulation layer pattern 235 may be conformally formed on an inner wall of a first recess 220 that may be formed through the first insulating interlayer 190, the first stress relief layer 156 and a portion of the first substrate 100, the first barrier layer pattern 245 may be conformally formed on the first insulation layer pattern 245, and the first metal layer pattern 255 may fill a remaining portion of the first recess 220 on the first barrier layer pattern 245. Thus, a sidewall and a bottom of the first via electrode 265 may be enclosed by the first insulation layer pattern 235.

The first insulation layer pattern 235 may include an oxide or a nitride, the first barrier layer pattern 245 may include a metal or a metal nitride, and the first metal layer pattern 255 may include a metal. For example, the first barrier layer pattern 245 may include tantalum, tantalum nitride, titanium, titanium nitride, ruthenium, cobalt, nickel, nickel boride, tungsten nitride, etc., and the first metal layer pattern 255 may include copper or tungsten. Each of the first barrier layer pattern 245 and the first metal layer pattern 255 may have a single layered structure or a multi-layered structure.

At least a portion of a sidewall of the first via structure 275 may be surrounded by the first stress relief layer 156, and thus may not directly contact the first substrate 100 at the portion of the sidewall of the first via structure 275. As a result, a stress of the first via structure 275 on the first substrate 100 or the circuit devices on the first substrate 100 may be reduced.

The first via electrode 265 of the first via structure 275 may mainly include a metal, however, the first substrate 100 may include a semiconductor material such as silicon. Therefore a stress may be generated between the first via structure 275 and the first substrate 100 because of the difference of the coefficients of thermal expansion of the materials thereof during subsequent heat treatment processes. Thus, the operation characteristics or the reliability of the circuit devices on the first substrate 100, e.g., the transistor may be deteriorated.

Further, the first barrier layer pattern 245 may be exfoliated because of the difference of the coefficients of thermal expansion or the difference of the adhesion between the first metal layer pattern 255 and the first barrier layer pattern 245 or between the first barrier layer pattern 245 and the first insulation layer pattern 235.

However, in accordance with various embodiments, the first stress relief layer 156 may be formed between the first substrate 100 and the first via structure 275, so that the stress between the first substrate 100 and the first via structure 275 due to the difference of the coefficients of the thermal expansion thereof may be reduced. Thus, the operation characteristics and the reliability of the circuit devices on the first substrate 100 may be prevented or reduced.

According to the decrease of the design rule, circuit devices may be more sensitive to the stress, and more distance may be needed between a via structure and the circuit devices. However, due to the stress relief layer, the circuit devices may be less stressed so that more integrated semiconductor devices may be manufactured. Additionally, a parasitic capacitance due to the via structure may be reduced because the stress relief layer may be deeply formed, and thus an RC delay, noises and cross-talks may be reduced.

Furthermore, the exfoliation in the first via structure 275 may be reduced.

Particularly, the first stress relief layer 156 may have a thickness, e.g., equal to or more than about 2 times larger than a thickness of the isolation layer 152, and thus the stress relieving effect or the exfoliation relieving effect may be increased. According to the experiment, when the thickness of the first stress relief layer 156 increased from about 0.25 um to about 0.5 um, that is, when the first stress relief layer 156 enclosed the sidewall of the first via structure 275 about two times, the stress of the first via structure 275 on the first substrate 100 was reduced by about 10.5%.

A second insulating interlayer 280 may be formed on the first insulating interlayer 190, and the first and second wirings 322 and 324 may be formed in the second insulating interlayer 280.

In various embodiments, the second insulating interlayer 280 may include an oxide, and may include a material the same as that of the first insulating interlayer 190. In an example embodiment, the second insulating interlayer 280 may have a multi-layered structure, and thus the first via structure 275 may penetrate the second insulating interlayer 280 having the multi-layered structure. A buffer layer including silicon nitride may be further formed between the first and second insulating interlayers 190 and 280.

The first wiring 322 may be formed in the first region I, and may be electrically connected to the impurity regions 180 via a first plug 200 penetrating the first insulating interlayer 190. The second wiring 324 may be formed in the second region II, and may be electrically connected to the first via structure 275. In various embodiments, the first wiring 322 may include a second barrier layer pattern 302 on a bottom and a sidewall of a first opening 292 through the second insulating interlayer 280, and a second metal layer pattern 312 filling a remaining portion of the first opening 292 on the second barrier layer pattern 302. The second wiring 324 may include a third barrier layer pattern 304 on a bottom and a sidewall of a second opening 294 through the second insulating interlayer 280, and a third metal layer pattern 314 filling a remaining portion of the second opening 294 on the third barrier layer pattern 304.

In FIG. 1, the first and second insulating interlayers 190 and 280 and the first and second wirings 322 and 324 are shown, however, more insulating interlayers and more wirings may be further formed.

Particularly, in FIG. 1, the first via structure 275 is shown to penetrate the first stress relief layer 156, a portion of the second region II of the first substrate 100 and the first insulating interlayer 190, however, the first via structure 275 may further penetrate the second insulating interlayer 280 containing the wirings 322 and 324. In this case, the first via structure 275 may not be electrically connected to the second wiring 324, and may be electrically connected to other wirings in the second insulating interlayer 280.

Figure 2:
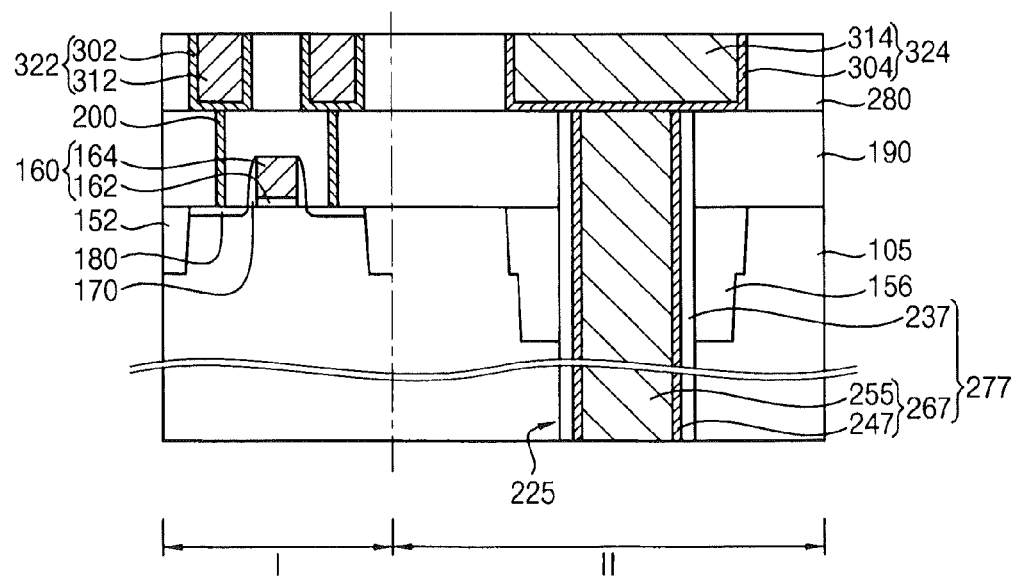
FIG. 2 is a cross-sectional view illustrating a semiconductor device in accordance with various embodiments.

FIG. 2 is a cross-sectional view illustrating a semiconductor device in accordance with various embodiments. The semiconductor device of FIG. 2 may be the same as or similar to that of FIG. 1 except for the substrate and the via structure. Thus, like reference numerals refer to like elements, and detailed descriptions thereon are omitted herein.

Referring to FIG. 2, a second via structure 277 may penetrate a second substrate 105, and may further penetrate a first insulating interlayer 190.

The second via structure 277 may include a second insulation layer pattern 237 and a fourth barrier layer pattern 247 sequentially stacked on a sidewall of a third opening 225 through the second substrate 105 and the first insulating interlayer 190, and a first metal layer pattern 255 filling a remaining portion of the third opening 225 on the fourth barrier layer pattern 247. That is, the second via structure 277 may include a second via electrode 267 and the fourth insulation layer pattern 237 surrounding a sidewall of the second via electrode 267, and the second via electrode 267 may include the fourth barrier layer pattern 247 and the first metal layer pattern 255.

The second substrate 105 may be formed by removing a lower portion of the first substrate 100, and thus may have a thickness less than that of the first substrate 100. In a real fabrication process, a lower portion of the first substrate 100 and portions of the first insulation layer pattern 235 and the first barrier layer pattern 245 on a bottom of the first recess 220 in FIG. 1 may be removed to form the semiconductor device of FIG. 2, and thus the first via structure 275 may be transformed into the second via structure 277. A bottom of the second via electrode 267 in the second via structure 277 may be exposed, and thus may be electrically connected to other semiconductor devices, e.g., semiconductor chips.

Hereinafter, only the via structure penetrating a portion of the substrate as shown in FIG. 1 may be illustrated, however, those skilled in the art may easily know that via structures penetrating the substrate and being electrically connected to other semiconductor devices may be within the scope of the present inventive concept.

FIGS. 3 to 10 are cross-sectional views illustrating a method of manufacturing a semiconductor device in accordance with various embodiments. This method may be used in manufacturing the semiconductor device of FIG. 1, however, may not be limited thereto.

Figure 3:
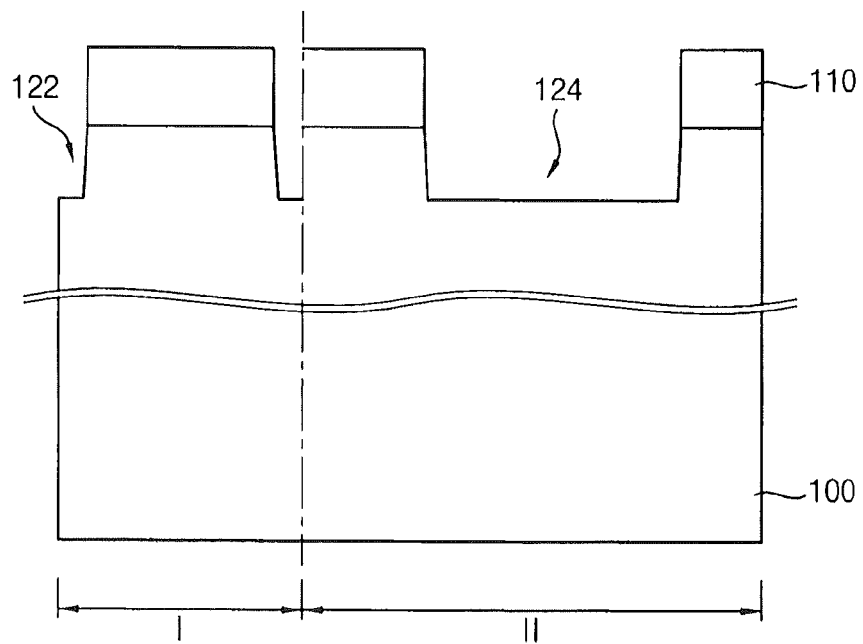
FIGS. 3 to 10 are cross-sectional views illustrating a method of manufacturing a semiconductor device in accordance with various embodiments.

Referring to FIG. 3, a first photoresist 110 may be formed on a first substrate 100, and a portion of the first substrate 100 may be removed using the first photoresist pattern 110 as an etching mask to form first and second trenches 122 and 124.

The first substrate 100 may be a silicon substrate, a germanium substrate, a silicon-germanium substrate, an SOI substrate, a GOI substrate, etc. The first substrate 100 may include a first region I and a second region II. The first region I may be a circuit region in which circuit devices may be formed, and the second region II may be a via region in which a first via structure 275 may be formed. The first region I may include a cell region in which memory cells may be formed and a peripheral circuit region in which peripheral circuits may be formed.

In various embodiments, the first trench 122 may be formed on the first region I of the first substrate 100, and the second trench 124 may be formed on the second region II of the first substrate 100. The second trench 124 may be formed to have a width greater than that of the first trench 122. In various embodiments, the first and second trenches 122 and 124 may be formed to have a depth the same as each other.

The first photoresist pattern 110 may be removed.

Figure 4:
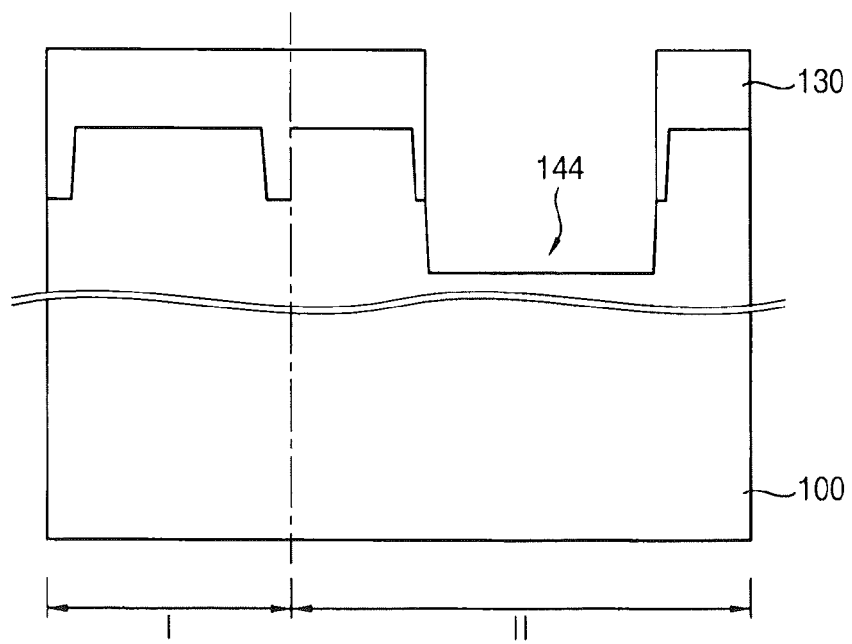

Referring to FIG. 4, a second photoresist pattern 130 may be formed on the first substrate 100 having the first and second trenches 122 and 124 thereon, and an upper portion of the first substrate 100 may be removed using the second photoresist pattern 130 as an etching mask to form a third trench 144.

Particularly, the second photoresist pattern 130 may cover a portion of the first substrate 100 in which the second trench 124 is not formed. That is, the second photoresist pattern 130 may be formed to cover a top surface of the first trench 122 and a top surface of the first substrate 100 in which neither the first trench 122 nor the second trench 124 is formed. The second photoresist pattern 130 may cover an edge portion of the second trench 124.

According as the second photoresist pattern 130 may expose a central portion or the whole portion of the second trench 124, in the etching process, the third trench 144 may be formed to have a width the same as or less than that of the second trench 124, and may be formed in the second trench 124. The second and the third trenches 124 and 144 may be referred to as a second trench structure. The second trench structure may have a width that may decrease from a top portion to a bottom portion thereof. In various embodiments, the second trench structure may have a stepped cross section having a width that may decrease with a depth of the second trench structure. In an example embodiment, the second trench structure may have a width equal to or more than about 2 times of that of the first trench 122.

The second photoresist pattern 130 may be removed.

Figure 5:
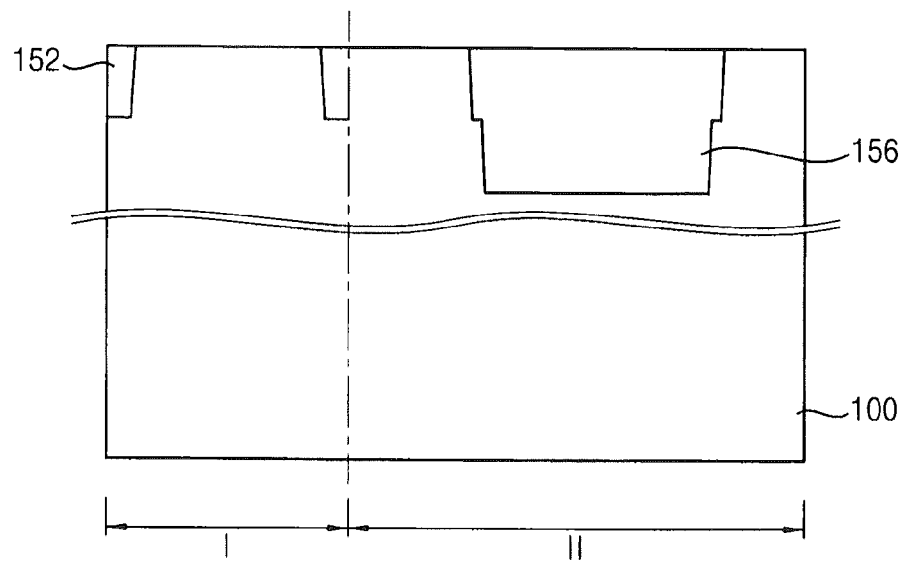

Referring to FIG. 5, an isolation layer 152 and a first stress relief layer 156 filling the first trench 122 and the second trench structure, respectively, may be formed. The first stress relief layer 156 and the isolation layer 152 may include the identical material. The isolation layer 152 and the first stress relief layer 156 may be formed from the same layer.

In various embodiments, the isolation layer 152 and the first stress relief layer 156 may be formed using an oxide by a chemical vapor deposition (CVD) process, an atomic layer deposition (ALD) process, a physical vapor deposition (PVD) process, etc. In addition, the isolation layer 152 and the first stress relief layer 156 may include an oxide having good gap filling characteristics, e.g., TOSZ, FOX, SOG, etc. In an example embodiment, the isolation layer 152 and the first stress relief layer 156 may have a multi-layered structure of an oxide layer and a nitride layer.

Figure 6:
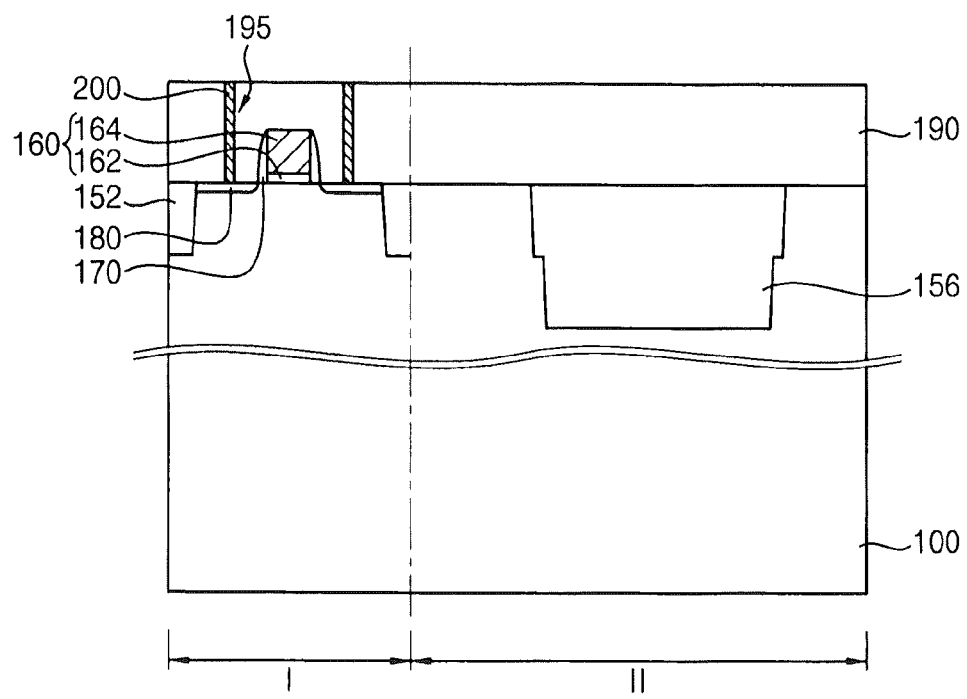

Referring to FIG. 6, circuit devices may be formed on the first region I of the first substrate 100, and a first insulating interlayer 190 covering the circuit devices may be formed on the first substrate 100. That is, a front end of line (FEOL) process may be performed.

In various embodiments, a transistor as the circuit device may be formed. Particularly, a gate insulation layer and a gate conductive layer may be sequentially formed on the first substrate 100, the isolation layer 152 and the first stress relief layer 156, and the gate conductive layer and the gate insulation layer may be patterned using a hard mask as an etching mask to form a gate structure including a gate insulation layer pattern 162 and a gate electrode 164 sequentially stacked. The gate insulation layer and the gate conductive layer may be formed by a CVD process, an ALD process, a PVD process, etc. Alternatively, the gate insulation layer may be formed by a heat treatment on a portion of the first substrate 100. In various embodiments, the gate insulation layer may be formed to include silicon oxide, and the gate conductive layer may be formed to include doped polysilicon, a metal, a metal nitride, etc.

After removing the hard mask, a gate spacer layer covering the gate structure 160 may be formed on the first substrate 100, the isolation layer 152 and the first stress relief layer 156, and the gate spacer layer may be anisotropically etched to form a gate spacer 170 on a sidewall of the gate structure 160. In various embodiments, the gate spacer layer may be formed to include silicon nitride.

A third photoresist pattern covering the second region II of the first substrate 100 may be formed, and an ion implantation process using the third photoresist pattern, the gate structure 160 and the gate spacer 170 as an ion implantation mask to form impurity regions 180 at upper portions of the first region I of the first substrate 100 adjacent to the gate structure 160 may be performed. In various embodiments, the impurity regions 180 may be formed to include n-type impurities, e.g., phosphorus, arsenic, etc., or p-type impurities, e.g., boron, aluminum, etc. A channel region in which electric charges may move may be formed at a portion of the first substrate 100 between the impurity regions 180.

The gate structure 160 and the impurity regions 180 may form the transistor, and the impurity regions 180 may serve as source/drain regions of the transistor.

The transistor may be an example of the circuit devices, and other types of circuit devices, e.g., diodes, word lines, bit lines, etc. may be also formed.

After removing the third photoresist pattern, a first insulating interlayer 190 covering the transistor may be formed on the first substrate 100.

In various embodiments, the first insulating interlayer 190 may be formed to include an oxide, e.g., BPSG, USG, SOG, etc. by a CVD process, an ALD process, a PVD process, etc.

A fourth photoresist pattern may be formed on the first insulating interlayer 190, and the first insulating interlayer 190 may be etched using the fourth photoresist pattern as an etching mask to form a contact hole 195 exposing the impurity regions 180. A first conductive layer filling the contact hole 195 may be formed on the exposed impurity regions 180 and the first insulating interlayer 190, and the first conductive layer may be planarized until a top surface of the first insulating interlayer 190 may be exposed to form a first plug 200 filling the contact hole 195. The first conductive layer may be formed to include a metal, a metal nitride, doped polysilicon, etc.

Figure 7:
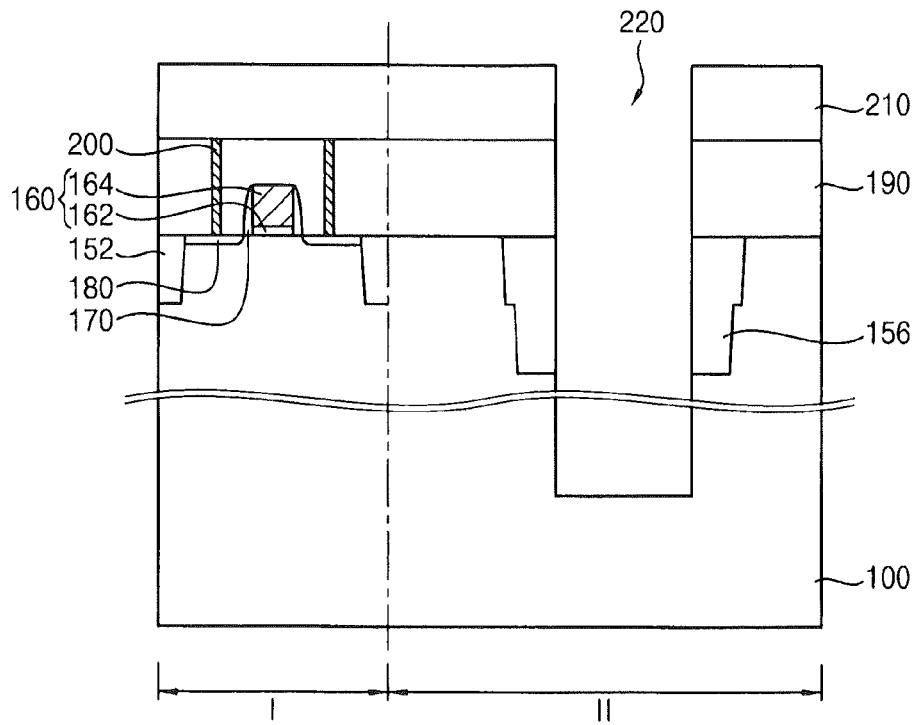

Referring to FIG. 7, after the FEOL process, a fifth photoresist pattern 210 may be formed on the first insulating interlayer 190, and the first insulating interlayer 190, the first stress relief layer 156 and at least a portion of the first substrate 100 may be removed using the fifth photoresist pattern 210 as an etching mask to form a first recess 220.

In various embodiments, the fifth photoresist pattern 210 may have a sidewall perpendicular to a top surface of the first substrate 100, e.g., a vertical sidewall, and thus the first recess 220 may be formed to have a sidewall perpendicular to the top surface of the first substrate 100, e.g., a vertical sidewall.

Figure 8:
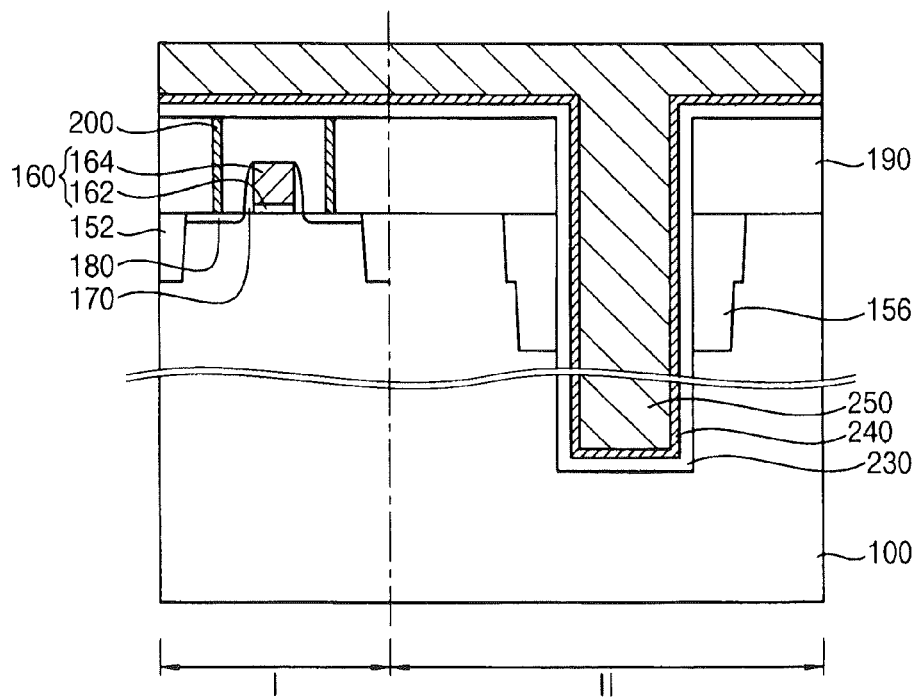

Referring to FIG. 8, after removing the fifth photoresist pattern 210, a first insulation layer 230, a first barrier layer 240 and a first metal layer 250 may be sequentially formed on the first substrate 100 and the first insulating interlayer 190 to fill the first recess 220.

Particularly, the first insulation layer 230 may be conformally formed on an inner wall of the first recess 220 and the first insulating interlayer 190. In various embodiments, the first insulation layer 230 may be formed to include an oxide or a nitride.

The first barrier layer 240 may be conformally formed on the first insulation layer 230. In various embodiments, the first barrier layer 240 may be formed to include a metal or a metal nitride, e.g., tantalum, tantalum nitride, titanium, titanium nitride, ruthenium, cobalt, nickel, nickel boride, tungsten nitride, etc.

A first seed layer may be formed on the first barrier layer 240. In various embodiments, the first seed layer may be formed using copper or tungsten by a PVD process.

The metal layer 250 may be formed on the first seed layer to fill a remaining portion of the first recess 220. In various embodiments, the first metal layer 250 may be formed using copper or tungsten by an electrolytic plating process.

Figure 9:
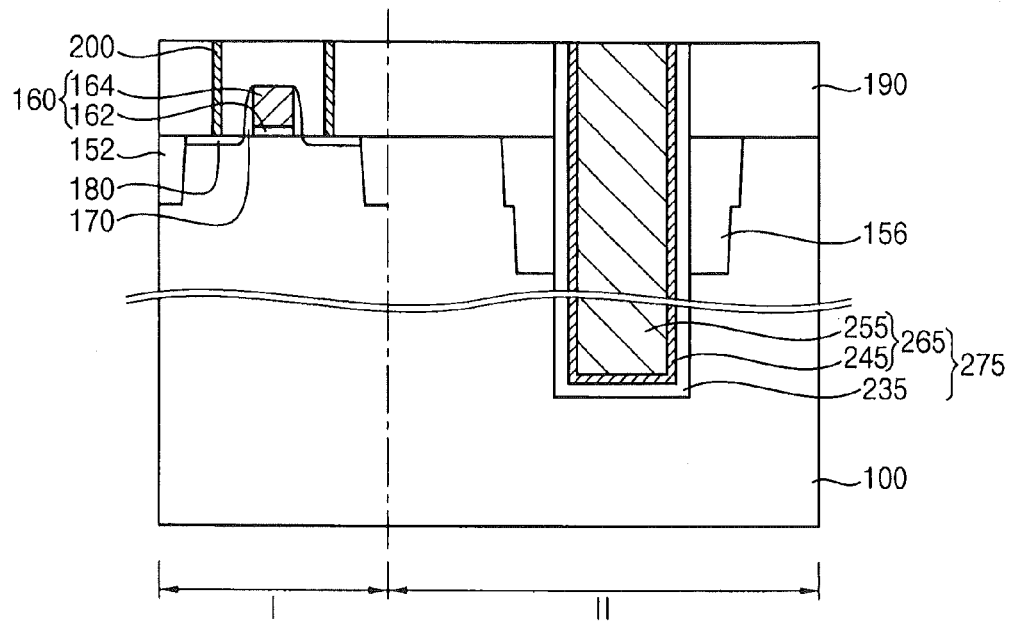

Referring to FIG. 9, the metal layer 250, the first barrier layer 240 and the first insulation layer 230 may be planarized until a top surface of the first insulating interlayer 190 may be exposed to form a first via structure 275 filling the first recess 220. The first via structure 275 may include a first insulation layer pattern 235 conformally formed on the inner wall of the first recess 220, a first barrier layer pattern 245 conformally formed on the first insulation layer pattern 235, and a first metal layer pattern 255 filling a remaining portion of the first recess 220. The first metal layer pattern 255 and the first barrier layer pattern 245 may form a first via electrode 265.

At least a portion of a sidewall of the first via structure 275 may be surrounded by the first stress relief layer 156 and the first via structure 275 in the first substrate 100 may have a portion exposed by the first stress relief layer 156.

Figure 10:
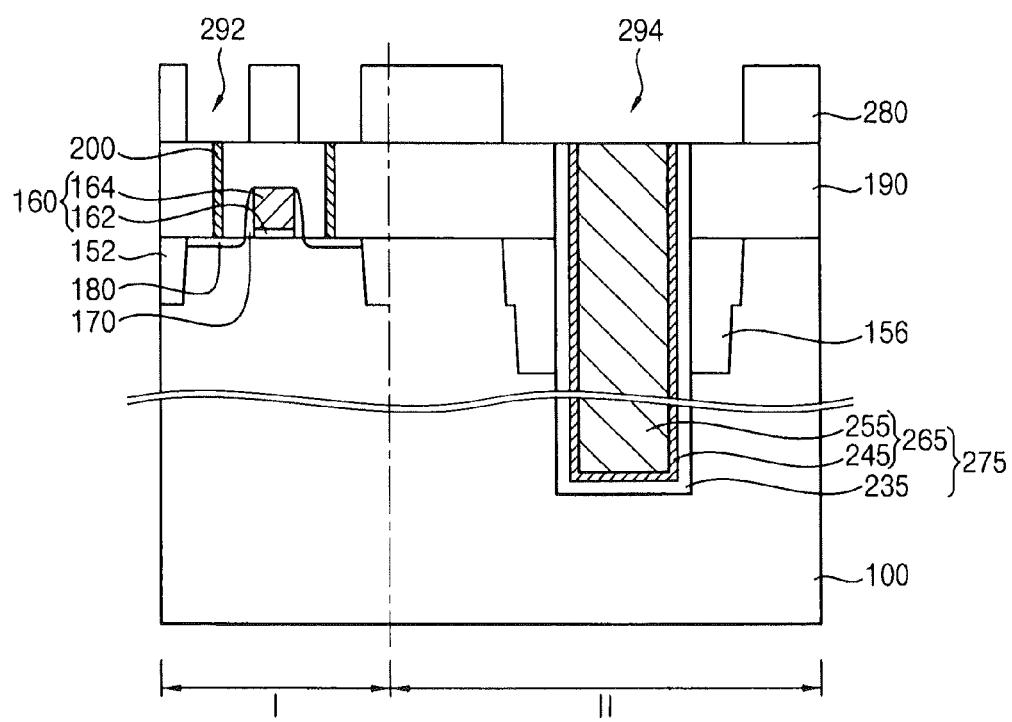

Referring to FIG. 10, a back end of line (BEOL) process may be performed.

A second insulating interlayer 280 may be formed on the first insulating interlayer 190, the first via structure 275 and the first plug 200, and first and second openings 292 and 294 that may be formed through the second insulating interlayer 280 and expose the first plug 200 and the first via structure 275, respectively, may be formed.

The second insulating interlayer 280 may be formed to include an oxide. In an example embodiment, the second insulating interlayer 280 may be formed to include a material the same as that of the first insulating interlayer 190.

A sixth photoresist pattern may be formed on the second insulating interlayer 280, and the second insulating interlayer 280 may be etched using the sixth photoresist pattern as an etching mask to form the first and second openings 292 and 294.

Referring to FIG. 1 again, after removing the sixth photoresist pattern, a second barrier layer and a second metal layer may be sequentially formed on the first plug 200, the first via structure 275 and the second insulating interlayer 280 to fill the first and second openings 292 and 294.

A second barrier layer may be conformally formed on an inner wall of the first and second openings 292 and 294 and the second insulating interlayer 280. In various embodiments, the second barrier layer may be formed to include a metal or a metal nitride, e.g., tantalum, tantalum nitride, titanium, titanium nitride, ruthenium, cobalt, nickel, nickel boride, tungsten nitride, etc. A second seed layer may be formed on the second barrier layer. In various embodiments, the second seed layer may be formed using copper or tungsten by a PVD process. A second metal layer may be formed on the second seed layer to fill remaining portions of the first and second openings 292 and 294. In various embodiments, the second metal layer may be formed using copper or tungsten by an electrolytic plating process.

The second metal layer and the second barrier layer may be planarized until a top surface of the second insulating interlayer 280 may be exposed to form a first wiring 322 filling the first opening 292 and a second wiring 324 filling the second opening 294. The first wiring 322 may include a second barrier layer pattern 302 on the inner wall of the first opening 292 and a second metal layer pattern 312 filling a remaining portion of the first opening 292. The second wiring 324 may include a third barrier layer pattern 304 on the inner wall of the second opening 294 and a third metal layer pattern 314 filling a remaining portion of the second opening 294.

Alternatively, the first and second wirings 322 and 324 may be formed not by the same process but by independent processes.

In FIG. 1, only the first and second insulating interlayers 190 and 280 are shown, however, more insulating interlayers and more wirings may be formed.

The first via structure 275 may be formed to penetrate not only the first stress relief layer 156, the portion of the second region II of the first substrate 100 and the first insulating interlayer 190 but also the second insulating interlayer 280 containing the wirings 322 and 324.

In this case, the semiconductor device may be formed by forming a photoresist pattern on the second insulating interlayer 280 having the first and second wirings 322 and 324 therein, forming a trench through the second insulating interlayer 280, the first insulating interlayer 190, the first stress relief layer 156 and the portion of the second region II of the first substrate 100 using the photoresist pattern as an etching mask, and filling the trench with the first via structure 275.

Alternatively, after the second insulating interlayer 280 containing plugs is formed on the first insulating interlayer 190 before forming the wirings 322 and 324, a trench may be formed through the second insulating interlayer 280, the first insulating interlayer 190, the first stress relief layer 156 and a portion of the second region II of the first substrate 100, and the first via structure 275 filling the trench may be formed. The second insulating interlayer 280 may be partially removed to expose the plugs, and the wirings 322 and 324 electrically connected to the plugs may be formed. The first via structure 275 may not be electrically connected to the wirings 322 and 324, and may be electrically connected to other wirings on the second insulating interlayer 280.

When the second insulating interlayer 280 and the wirings 322 and 324 are formed at a high temperature, a stress may be applied to the first substrate 100 due to the difference of the coefficients of the thermal expansion between the first via structure 275 including a metal and the first substrate 100 including silicon, and thus the reliability of circuit devices, e.g., the transistor on the first substrate 100, may be deteriorated. Additionally, the first barrier layer pattern 245 may be exfoliated from the first metal layer pattern 255 or from the first insulation layer pattern 235.

However, in accordance with various embodiments, the first stress relief layer 156 may be formed between the first substrate 100 and the first via structure 275, and thus the stress due to the difference of the coefficients of the thermal expansion may be relieved. Accordingly, the operation characteristics and the reliability of the circuit devices on the first substrate 100 may not be deteriorated, and the exfoliation in the first via structure 275 may be reduced.

The first stress relief layer 156 may have a thickness, e.g., about 2 times or more than 2 times larger than a thickness of the isolation layer 152, so that the effect of relieving the stress or the reduction of the exfoliation may be increased.

Figure 11:
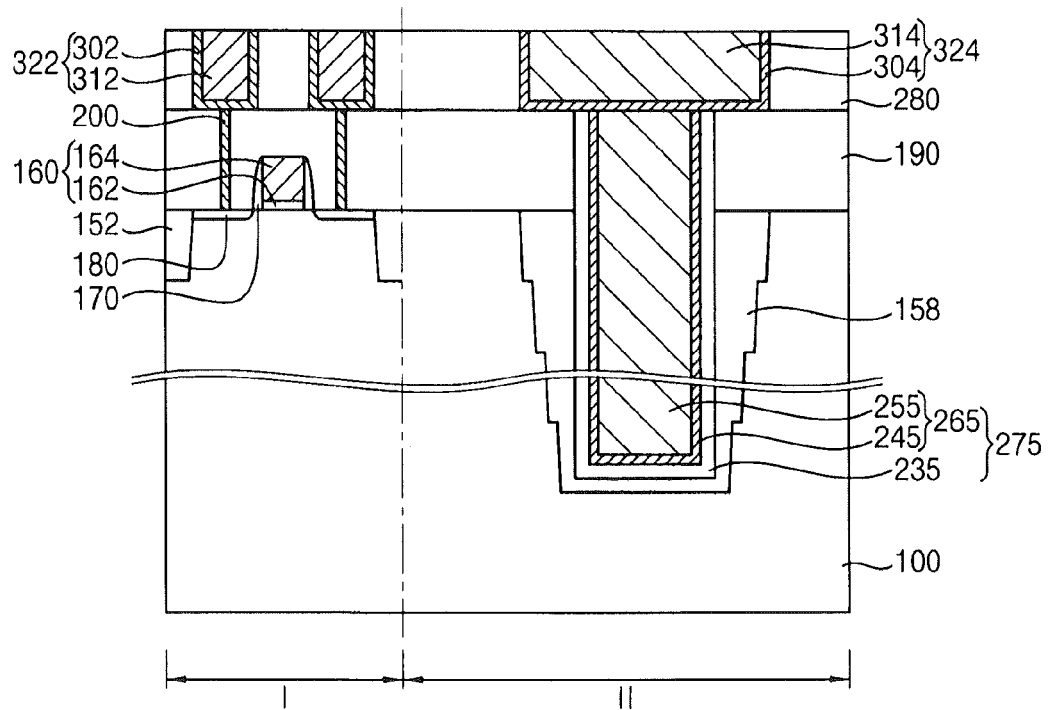
FIG. 11 is a cross-sectional view illustrating a semiconductor device in accordance with various embodiments.

FIG. 11 is a cross-sectional view illustrating a semiconductor device in accordance with various embodiments. The semiconductor device of FIG. 11 may be the same as or similar to that of FIG. 1 except for the shape of the stress relief layer. Thus, like reference numerals refer to like elements, and detailed descriptions thereon are omitted herein.

Referring to FIG. 11, the semiconductor device may include a second stress relief layer 158.

In various embodiments, the second stress relief layer 158 may enclose a first via structure 275 in the first substrate 100. That is, a portion of a sidewall and a bottom of the first via structure 275 in the first substrate 100 may be surrounded by the second stress relief layer 158, and thus the effect of relieving the stress of the first via structure 275 applied on the first substrate 100 or the effect of the reduction of the exfoliation in the first via structure 275 may be increased. The second stress relief layer 158 may not enclose the bottom of the first via structure 275.

In various embodiments, the second stress relief layer 158 may have a stepped cross section. The number of the steps may not be limited.

The semiconductor device of FIG. 11 including the second stress relief layer 158 may be easily manufactured by a method the same as or similar to the method of manufacturing the semiconductor device illustrated with reference to FIGS. 3 to 10. That is, lower trenches formed in an upper trench may be formed by repeatedly etching the first substrate 100 using photoresist patterns exposing a portion of the upper trench as an etching mask, so that a trench structure may be formed. Additionally, the trench structure may be filled with an insulating material to form the second stress relief layer 158.

Figure 12:
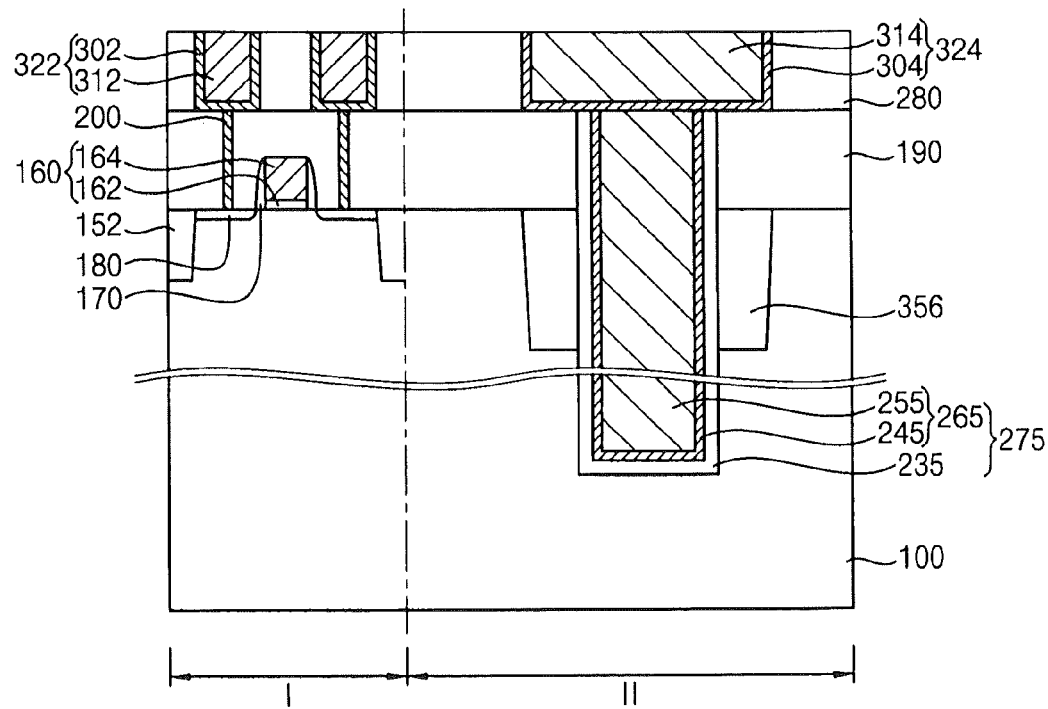
FIG. 12 is a cross-sectional view illustrating a semiconductor device in accordance with various embodiments.

FIG. 12 is a cross-sectional view illustrating a semiconductor device in accordance with various embodiments. The semiconductor device of FIG. 12 may be the same as or similar to that of FIG. 1 except for the shape of the stress relief layer. Thus, like reference numerals refer to like elements, and detailed descriptions thereon are omitted herein.

Referring to FIG. 12, the semiconductor device may include a third stress relief layer 356.

In various embodiments, the third stress relief layer 356 may surround a portion of a sidewall of a first via structure 275 in the first substrate 100.

In various embodiments, the third stress relief layer 356 may not have a stepped cross section but have a cross section with a straight sidewall. The third stress relief layer 356 may have a thickness greater than that of the isolation layer 152. In an example embodiment, the third stress relief layer 356 may have a thickness about two time or more than 2 times larger than that of the isolation layer 152.

Figure 13:
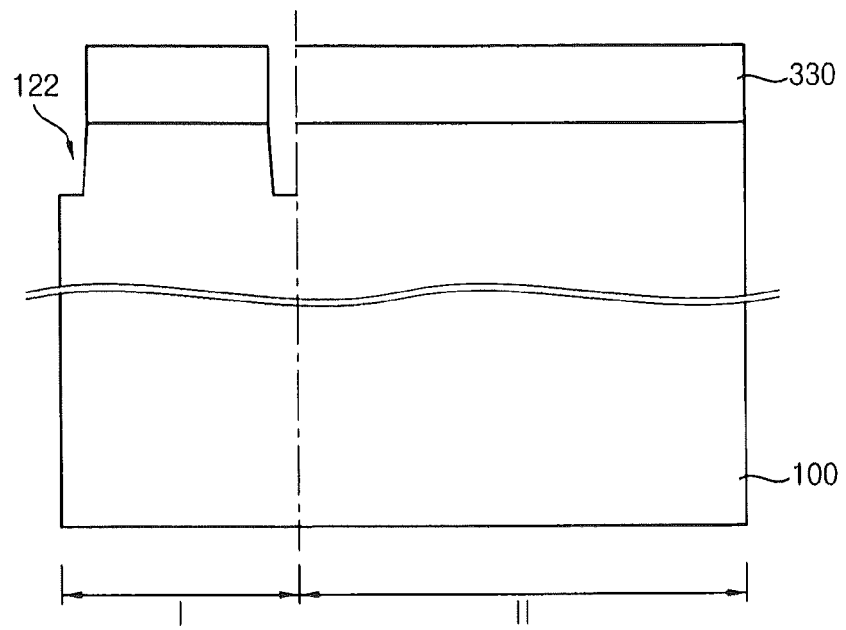
FIGS. 13 and 14 are cross-sectional views illustrating a method of manufacturing a semiconductor device in accordance with various embodiments.
Figure 14:
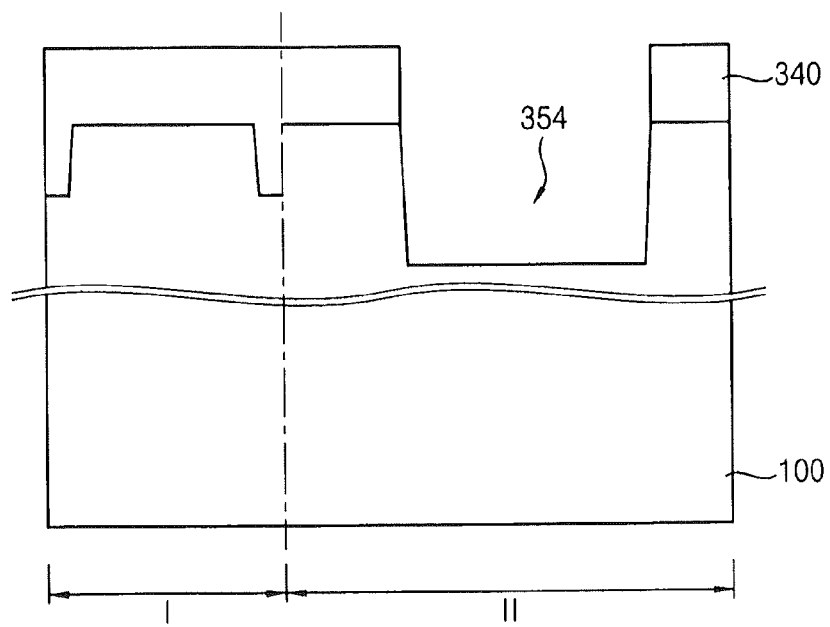

FIGS. 13 and 14 are cross-sectional views illustrating a method of manufacturing a semiconductor device in accordance with various embodiments. This method may be used in manufacturing the semiconductor device of FIG. 12, however, may not be limited thereto.

Referring to FIG. 13, a seventh photoresist pattern 330 may be formed on a first substrate 100, and the first substrate 100 may be etched using the seventh photoresist pattern 330 as an etching mask to form a first trench 122 on the first region I of the first substrate 100.

Referring to FIG. 14, an eighth photoresist pattern 340 may be formed on the first substrate 100 having the first trench 122 thereon, and a portion of the first substrate 100 may be etched using the eighth photoresist pattern 340 as an etching mask to form a fourth trench 354.

The eighth photoresist pattern 340 may expose a portion of the second region II of the first substrate 100, and the fourth trench 354 may be formed on the second region II. In various embodiments, the fourth trench 354 may be formed to have a depth larger than that of the first trench 122, e.g., about 2 times or more than 2 times larger than that of the first trench 122. The fourth trench 354 may be formed to have a width greater than that of the first trench 122.

Processes the same as or similar to those illustrated with reference to FIGS. 5 to 10 may be performed to manufacture the semiconductor device of FIG. 12.

In this method, the fourth trench 354 having a relatively deeper depth may be formed in a separate process so that the third stress relief layer 356 may have a thickness larger than that of the isolation layer 152.

Figure 15:
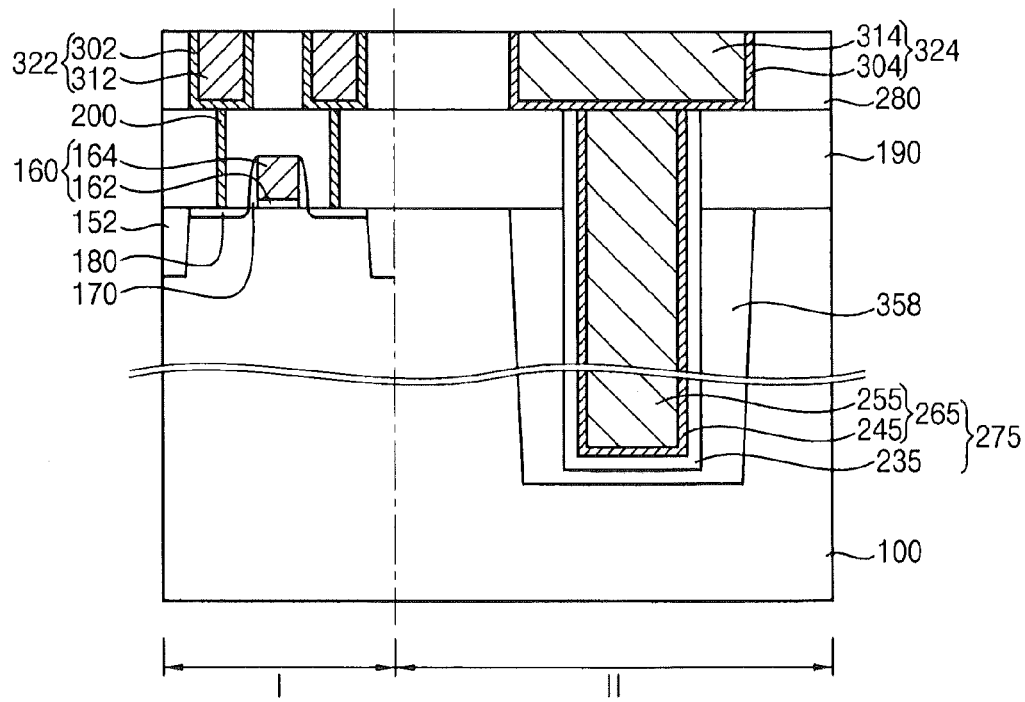
FIG. 15 is a cross-sectional view illustrating a semiconductor device in accordance with various embodiments.

FIG. 15 is a cross-sectional view illustrating a semiconductor device in accordance with various embodiments. The semiconductor device of FIG. 15 may be the same as or similar to that of FIG. 12 except for the shape of the stress relief layer. Thus, like reference numerals refer to like elements, and detailed descriptions thereon are omitted herein.

Referring to FIG. 15, the semiconductor device may include a fourth stress relief layer 358 having a cross section with a straight sidewall.

In various embodiments, the fourth stress relief layer 358 may enclose a portion of a first via structure 275 in the first substrate 100. That is, a portion of a sidewall and a bottom of the first via structure 275 that are formed in the first substrate 100 may be enclosed by the fourth stress relief layer 358, and thus the effect of relieving the stress of the first via structure 275 and the effect of relieving the exfoliation in the first via structure 275 may be increased. However, the fourth stress relief layer 358 may not enclose the bottom of the first via structure 275.

The semiconductor device of FIG. 15 including the fourth stress relief layer 358 may be manufactured by a method the same as or similar to the method of manufacturing the semiconductor device illustrated with reference to FIGS. 13 to 14 and FIGS. 5 to 10 and 1.

Figure 16:
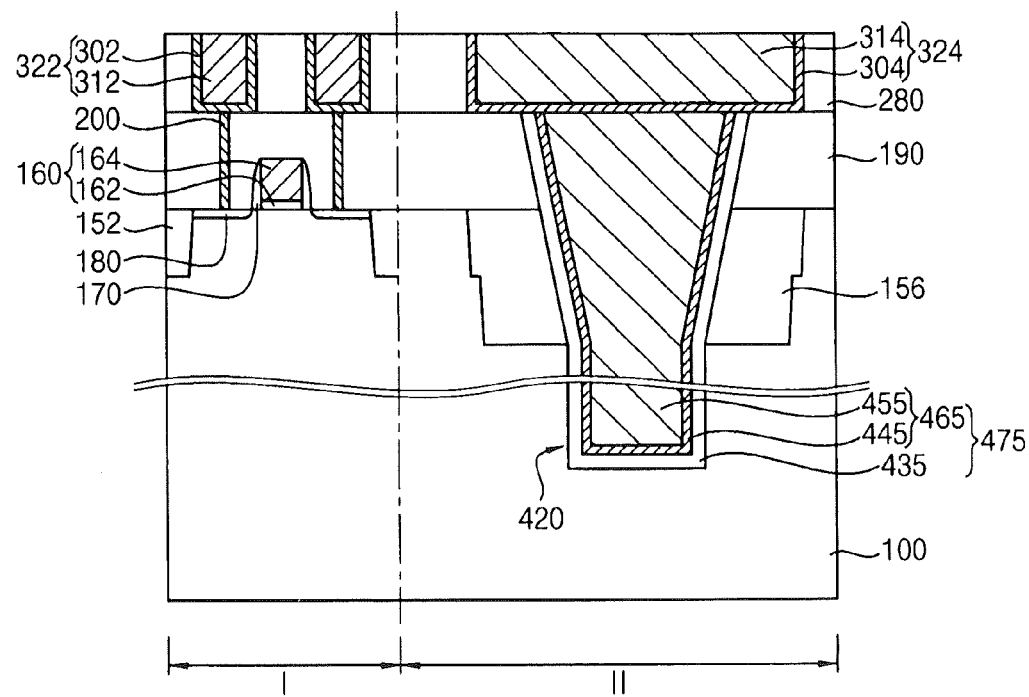
FIG. 16 is a cross-sectional view illustrating a semiconductor device in accordance with various embodiments.

FIG. 16 is a cross-sectional view illustrating a semiconductor device in accordance with various embodiments. The semiconductor device of FIG. 16 may be the same as or similar to that of FIG. 1 except for the shape of the via structure. Thus, like reference numerals refer to like elements, and detailed descriptions thereon are omitted herein.

Referring to FIG. 16, the semiconductor device may include a third via structure 475 having upper and lower portions.

In various embodiments, the upper portion of the third via structure 475 may be surrounded by the first insulating interlayer 190 and the first stress relief layer 156 and may have a width gradually decreasing with a depth of the third via structure 475. The lower portion of the third via structure 475 may be surrounded by the first substrate 100 and may have a constant width along the direction toward the inside of the first substrate 100.

The upper portion of the third via structure 475 may have a tapered profile so that sides of the upper portion of the third via structure 475 are not perpendicular to a top surface of the first substrate. The lower portion of the third via structure 475 may have a vertical profile so that sides of the lower portion of the third via structure 475 are perpendicular to the top surface of the first substrate.

The third via structure 475 may include a third insulation layer pattern 435, a fifth barrier layer pattern 445 and a fourth metal layer pattern 455 sequentially stacked. The third insulation layer pattern 435 may be conformally formed on an inner wall of a second recess 420 through the first insulating interlayer 190, the first stress relief layer 156 and a portion of the first substrate 100, and the fifth barrier layer pattern 445 may be conformally formed on the third insulation layer pattern 435. The fourth metal layer pattern 455 may fill a remaining portion of the second recess 420 on the fifth barrier layer pattern 445. Thus, a sidewall and a bottom of a third via electrode 465 including a fourth metal layer pattern 455 and the fifth barrier layer pattern 445 may be enclosed by the third insulation layer pattern 435.

The third via structure 475 may have an upper sidewall that is not perpendicular to the top surface of the first substrate 100 but slanted, and thus the exfoliation in the third via structure 475, i.e., the exfoliation between the fifth barrier layer pattern 445 and the fourth metal layer pattern 455 or between the fifth barrier layer pattern 445 and the third insulation layer pattern 435 may be effectively reduced. According to the results of the experiment, when the sidewall of the third via structure 475 made an acute angle, e.g., about 30° with respect to the top surface of the first substrate 100, the exfoliation was reduced by about 30% when compared to that of the third via structure 475 having a sidewall making a right angle with respect to the top surface of the first substrate 100.

Figure 17:
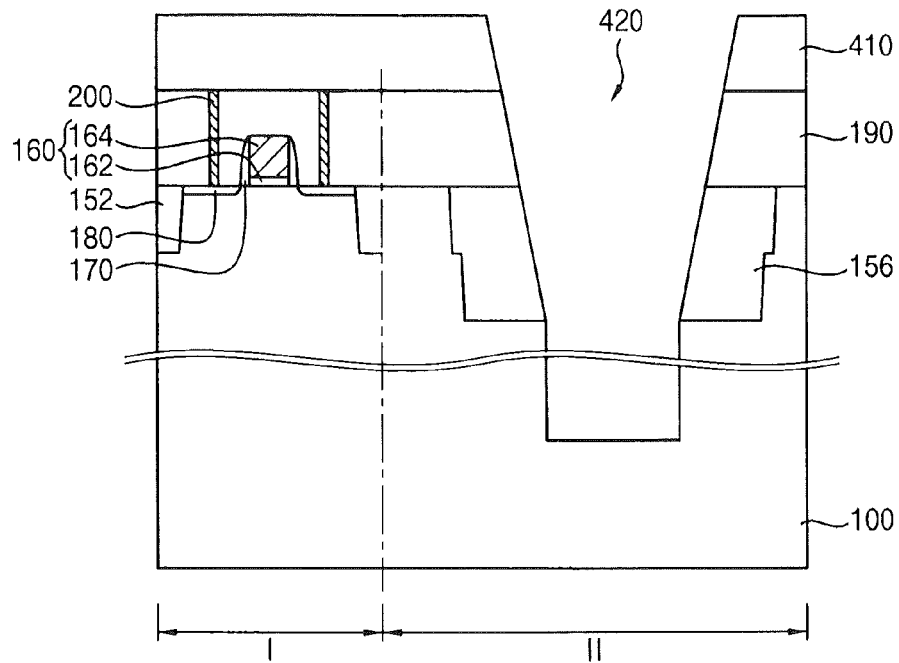
FIGS. 17 and 18 are cross-sectional views illustrating a method of manufacturing a semiconductor device in accordance with various embodiments.
Figure 18:
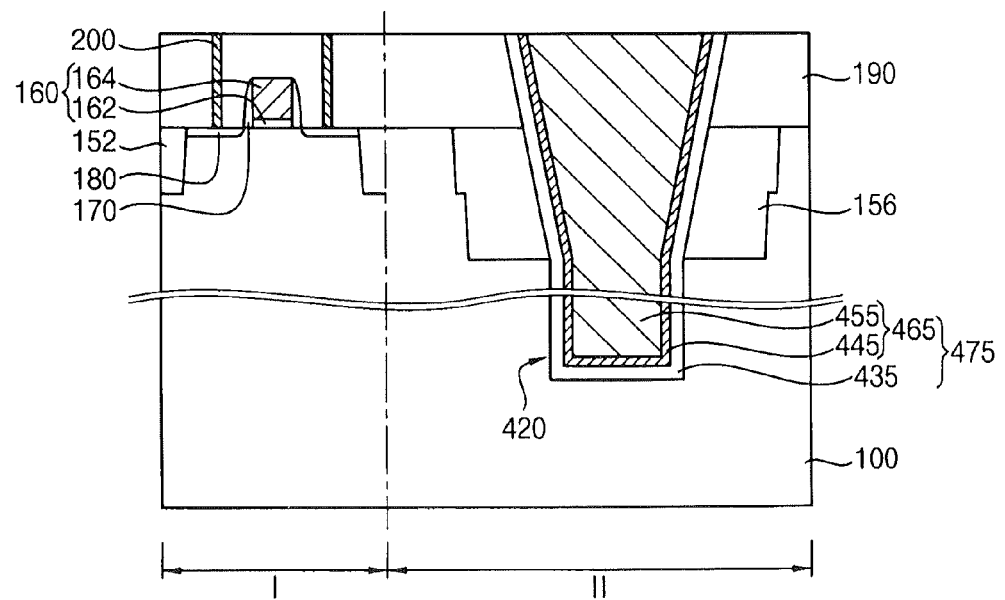

FIGS. 17 and 18 are cross-sectional views illustrating a method of manufacturing a semiconductor device in accordance with various embodiments. This method may be used in manufacturing the semiconductor device of FIG. 16, however, may not be limited thereto.

Processes the same as or similar to those illustrated with reference to FIGS. 3 to 6 may be performed.

Referring to FIG. 17, a ninth photoresist pattern 410 may be formed on the first insulating interlayer 190, and the first insulating interlayer 190, the first stress relief layer 156 and a portion of the first substrate 100 may be etched using the ninth photoresist pattern 410 as an etching mask to form a second recess 420 through the first insulating interlayer 190, the first stress relief layer 156 and the portion of the first substrate 100.

In various embodiments, the ninth photoresist pattern 410 may not have a vertical sidewall but a slanted sidewall, and thus an upper portion of the second recess 420 penetrating the first insulating interlayer 190 and the first stress relief layer 156 may have a slanted sidewall according to the slope of the sidewall of the ninth photoresist pattern 410. A lower portion of the second recess 420 penetrating the first substrate 100 including a semiconductor material, e.g., silicon that is not an oxide may have a vertical sidewall. An angle of the slope of the upper portion of the second recess 420 with respect to the top surface of the first substrate 100 may be changed by controlling the angle of the sidewall of the ninth photoresist pattern 410.

Referring to FIG. 18, after removing the ninth photoresist pattern 410, processes the same as or similar to those illustrated with reference to FIGS. 8 to 9 may be performed to form a third via structure 475 filling the second recess 420. The third via structure 475 may include a third insulation layer pattern 435 conformally formed on an inner wall of the second recess 420, a fifth barrier layer pattern 445 conformally formed on the third insulation layer pattern 435, and a fourth metal layer pattern 455 filling a remaining portion of the second recess 420. The fourth metal layer pattern 455 and the fifth barrier layer pattern 445 may form a third via electrode 465.

Referring to FIG. 16 again, processes the same as or similar to those illustrated with reference to FIGS. 10 and 11 may be performed to manufacture the semiconductor device.

Figure 19:
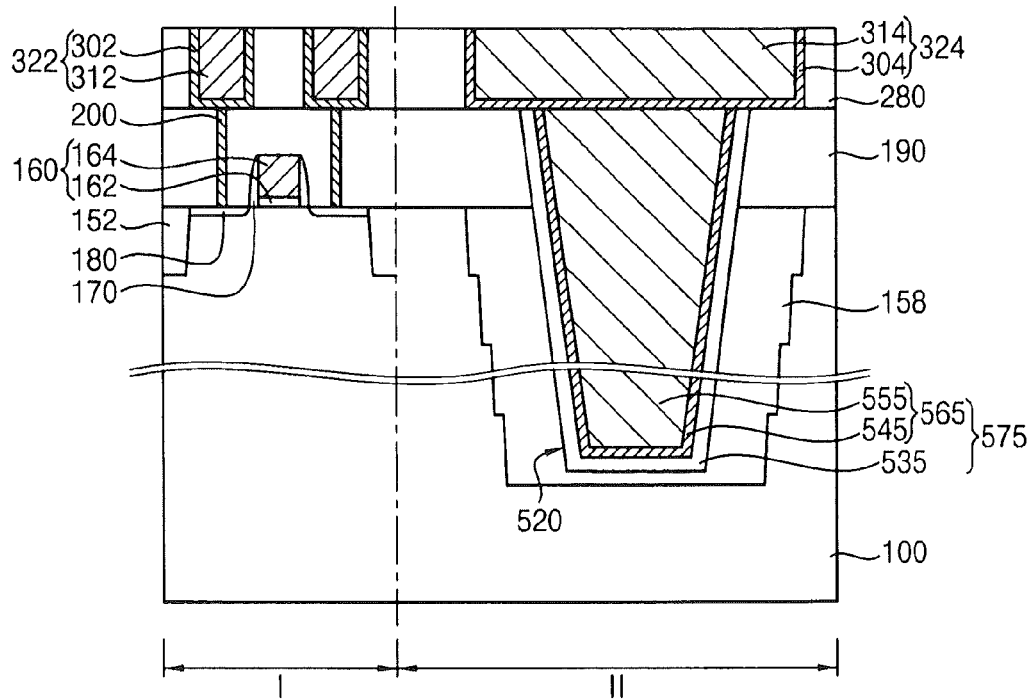
FIG. 19 is a cross-sectional view illustrating a semiconductor device in accordance with various embodiments.

FIG. 19 is a cross-sectional view illustrating a semiconductor device in accordance with various embodiments. The semiconductor device of FIG. 19 may be the same as or similar to that of FIG. 11 except for the shape of the via structure. Thus, like reference numerals refer to like elements, and detailed descriptions thereon are omitted herein.

Referring to FIG. 19, the semiconductor device may include a second stress relief layer 158 and a fourth via structure 575.

In various embodiments, the second stress relief layer 158 may enclose a fourth via structure 575 in the first substrate 100. That is, a portion of a sidewall and a bottom of the fourth via structure 575 in the first substrate 100 may be surrounded by the second stress relief layer 158. However, the second stress relief layer 158 may not enclose the bottom of the fourth via structure 575. In various embodiments, the second stress relief layer 158 may have a stepped cross section from a top portion to a bottom portion thereof. The number of the steps may not be limited.

In various embodiments, the fourth via structure 575 may have a width gradually decreasing from a top portion to a bottom portion thereof, i.e., with a depth of the fourth via structure 575. Thus, the fourth via structure 575 may have a cross section with a straight sidewall, however, the sidewall may not be perpendicular to a top surface of the first substrate 100 but slanted thereto unlike the first via structure 275 in FIG. 11. Additionally, the fourth via structure 575 may have the slanted sidewall with respect to the top surface of the first substrate 100 regardless of the position of the sidewall thereof unlike the third via structure 475 in FIG. 16.

The fourth via structure 575 may include a fourth insulation layer pattern 535 conformally formed on an inner wall of a third recess 520 through the first insulating interlayer 190 and a portion or the whole portion of the second stress relief layer 158, a sixth barrier layer pattern 545 conformally formed on the fourth insulation layer pattern 535, and a fifth metal layer pattern 555 filling a remaining portion of the third recess 520 on the sixth barrier layer pattern 545. The fifth metal layer pattern 555 and the sixth barrier layer pattern 545 may form a fourth via electrode 565.

Figure 20:
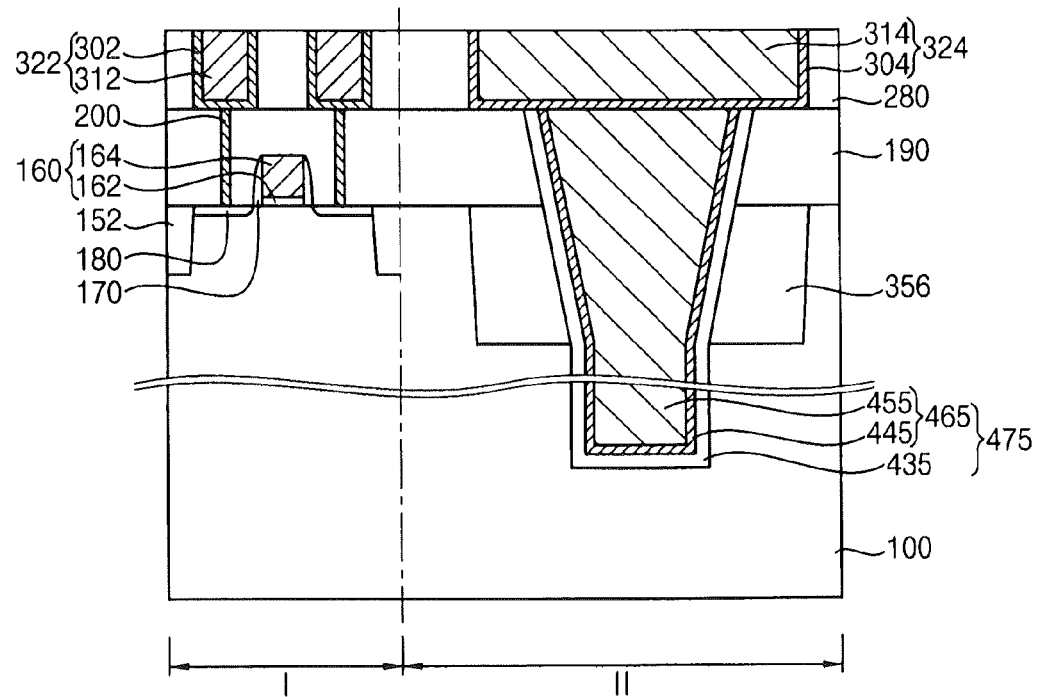
FIG. 20 is a cross-sectional view illustrating a semiconductor device in accordance with various embodiments.

FIG. 20 is a cross-sectional view illustrating a semiconductor device in accordance with various embodiments. The semiconductor device of FIG. 20 may be the same as or similar to that of FIG. 16 except for the shape of the stress relief layer. Thus, like reference numerals refer to like elements, and detailed descriptions thereon are omitted herein.

Referring to FIG. 20, the semiconductor device may include a third stress relief layer 356. In various embodiments, the third stress relief layer 356 may surround a portion of a sidewall of a third via structure 475 in the first substrate 100.

In various embodiments, the third stress relief layer 356 may not have a stepped cross section but a cross section with a straight sidewall, and may have a width greater than that of an isolation layer 152. In an example embodiment, the third stress relief layer 356 may have a width equal to or more than about 2 times of that of the isolation layer 152.

Figure 21:
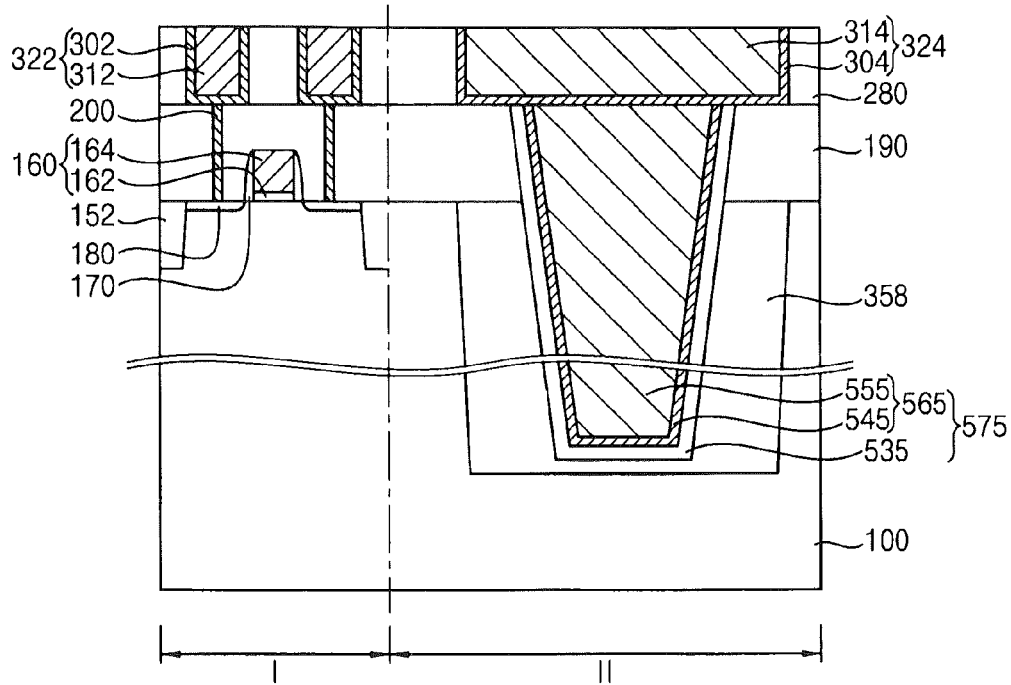
FIG. 21 is a cross-sectional view illustrating a semiconductor device in accordance with various embodiments.

FIG. 21 is a cross-sectional view illustrating a semiconductor device in accordance with various embodiments. The semiconductor device of FIG. 21 may be the same as or similar to that of FIG. 15 except for the shape of the via structure. Thus, like reference numerals refer to like elements, and detailed descriptions thereon are omitted herein.

Referring to FIG. 21, the semiconductor device may include a fourth stress relief layer 358 and a fourth via structure 575.

In various embodiments, the fourth stress relief layer 358 may enclose a portion of the fourth via structure 575 in the first substrate 100. That is, a portion of a sidewall and a bottom of the fourth via structure 575 that are formed in the first substrate 100 may be enclosed by the fourth stress relief layer 358. However, the fourth stress relief layer 358 may not enclose the bottom of the fourth via structure 575.

In various embodiments, the fourth via structure 575 may have a width gradually decreasing from a top portion to a bottom portion thereof, i.e., with a depth of the fourth via structure 575. Thus, the fourth via structure 575 may have a cross section with a straight sidewall, however, the sidewall thereof may not be perpendicular to a top surface of the first substrate 100 but slanted thereto.

Figure 22:
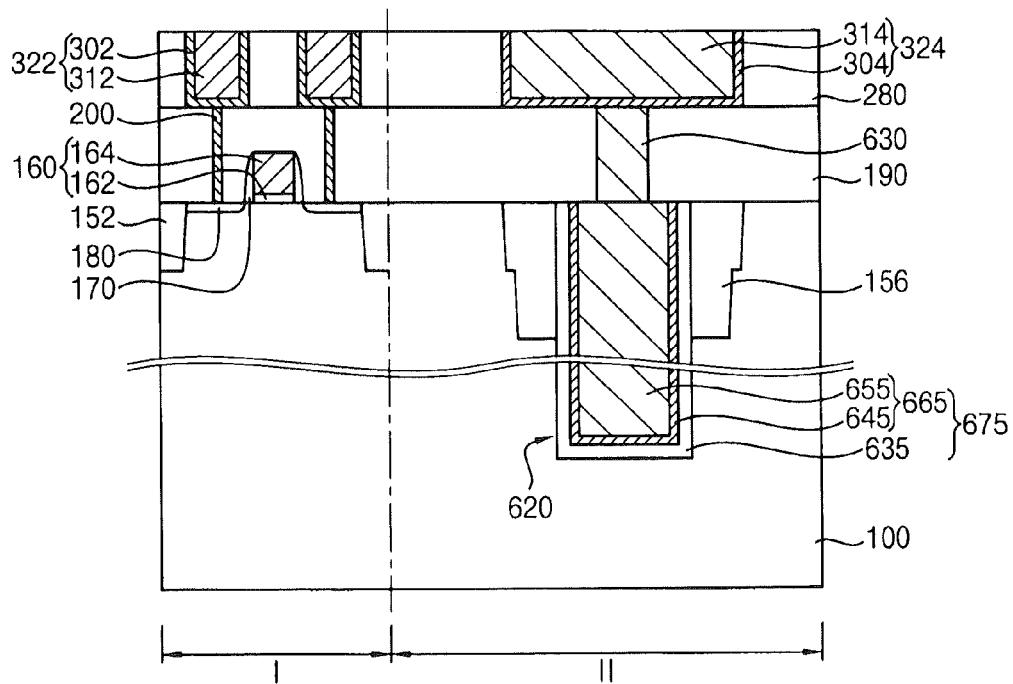
FIG. 22 is a cross-sectional view illustrating a semiconductor device in accordance with various embodiments.

FIG. 22 is a cross-sectional view illustrating a semiconductor device in accordance with various embodiments. The semiconductor device of FIG. 22 may be the same as or similar to that of FIG. 1 except for the shape of the via structure 675 and a plug. Thus, like reference numerals refer to like elements, and detailed descriptions thereon are omitted herein.

Referring to FIG. 22, the semiconductor device may include a fifth via structure 675.

The fifth via structure 675 may be formed through a first stress relief layer 156 and at least a portion of a first substrate 100. Thus, an upper sidewall of the fifth via structure 675 may be surrounded by the first stress relief layer 156. In various embodiments, the fifth via structure 675 may have a constant width with a depth of the fifth via structure 675. That is, the fifth via structure 675 may have a sidewall perpendicular to a top surface of the first substrate 100.

The fifth via structure 675 may have a fifth insulation layer pattern 635 conformally formed on an inner wall of a fourth recess 620 through a portion of the first substrate 100 and the first stress relief layer 156, a seventh barrier layer pattern 645 conformally formed on the fifth insulation layer pattern 635, and a sixth metal layer pattern 655 filling a remaining portion of the fourth recess 620 on the sixth barrier layer pattern 645. The sixth metal layer pattern 655 and the seventh barrier layer pattern 645 may form a fifth via electrode 665.

The fifth via structure 675 may be electrically connected to a second wiring 324 via a second plug 630 that may be formed through a first insulating interlayer 190. In FIG. 22, one second plug 630 is shown, however, a plurality of second plugs 630 may be also formed through the first insulating interlayer 190. The second plug 630 may include a metal, a metal nitride, doped polysilicon, etc.

Figure 23:
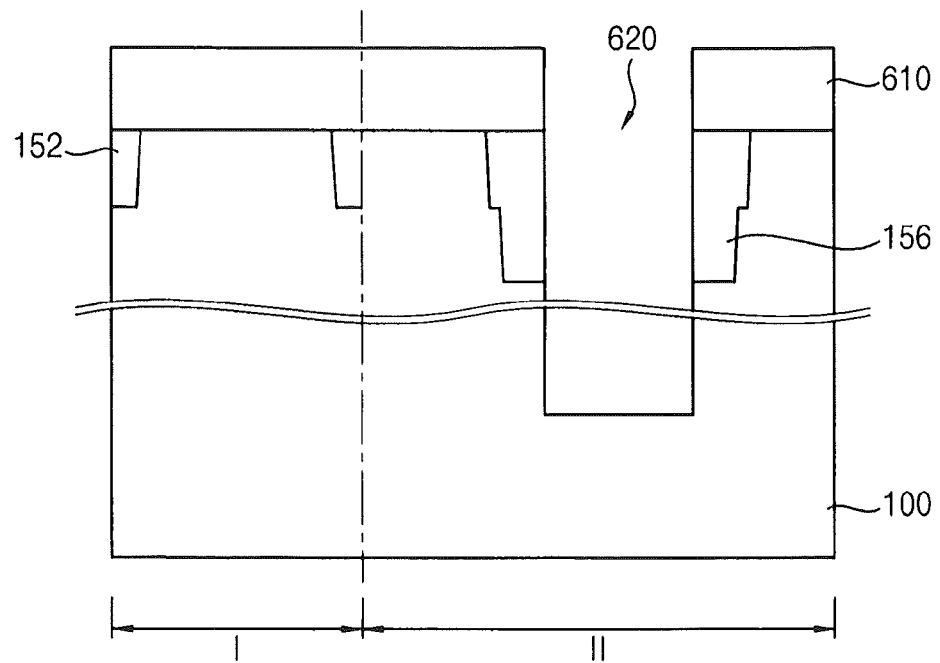
FIGS. 23 to 25 are cross-sectional views illustrating a method of manufacturing a semiconductor device in accordance with various embodiments.
Figure 24:
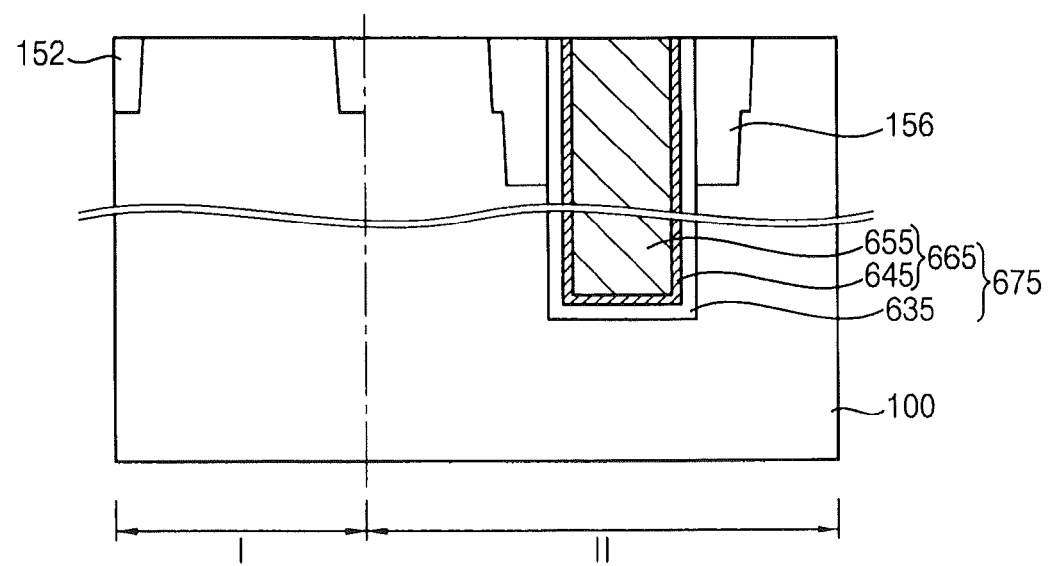
Figure 25:
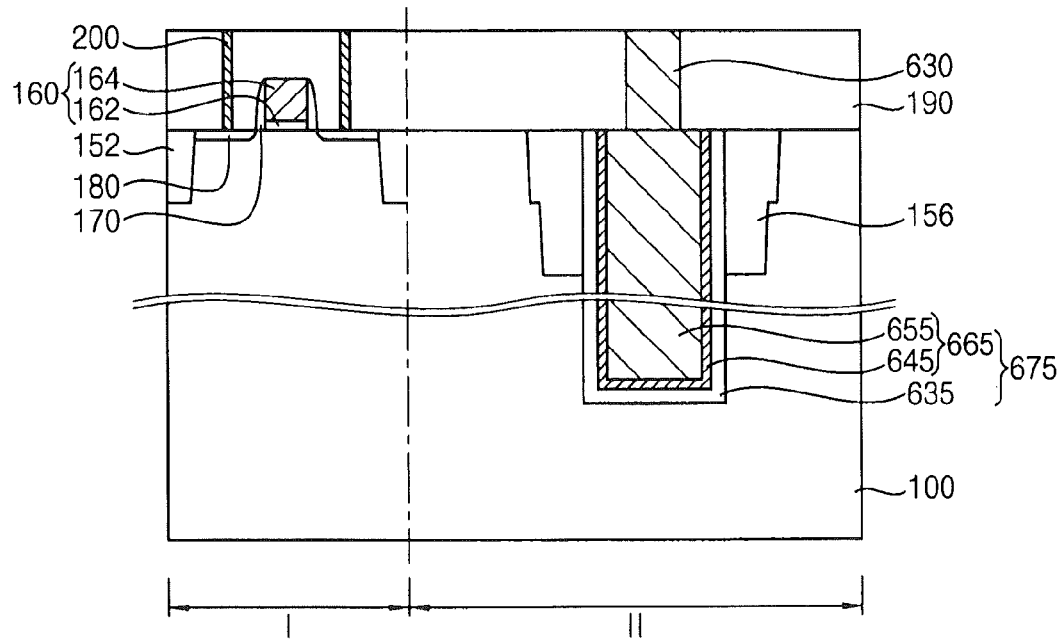

FIGS. 23 to 25 are cross-sectional views illustrating a method of manufacturing a semiconductor device in accordance with various embodiments. This method may be used in manufacturing the semiconductor device of FIG. 22, however, may not be limited thereto.

Processes the same as or similar to those illustrated with reference to FIGS. 3 to 5 may be performed.

Referring to FIG. 23, after forming a tenth photoresist pattern 610 on a first substrate 100, an isolation layer 152 and a first stress relief layer 156, the stress relief layer 156 and a portion of the first substrate 100 may be etched using the tenth photoresist pattern 610 as an etching mask to form a fourth recess 620.

Referring to FIG. 24, processes the same as or similar to those illustrated with reference to FIGS. 8 to 9 may be performed.

Thus, a fifth insulation layer pattern 635 may be conformally formed on an inner wall of the fourth recess 620, a seventh barrier layer pattern 645 may be conformally formed on the fifth insulation layer pattern 635, and a sixth metal layer pattern 655 may be formed on the seventh barrier layer pattern 645 to fill a remaining portion of the fourth recess 620. The sixth metal layer pattern 655 and the seventh barrier layer pattern 645 may form a fifth via electrode 665.

Referring to FIG. 25, a process similar to that illustrated with reference to FIG. 6 may be performed.

A transistor including a gate structure 160, a gate spacer 170 and impurity regions 180, a first insulating interlayer 190 covering the transistor, and a first plug 200 penetrating the first insulating interlayer 190 and contacting the impurity regions 180 may be formed on a first region I of a first substrate 100.

A process the same as that for forming the first plug 200 may be performed to form a second plug 630 penetrating the first insulating interlayer 190 and contacting the fifth via structure 675.

Referring to FIG. 21 again, processes the same as or similar to those illustrated with reference to FIGS. 10 and 11 may be performed.

Thus, a second insulating interlayer 280 may be formed on the first insulating interlayer 190, a first wiring 322 penetrating the second insulating interlayer 280 and contacting the first plug 200 may be formed, and a second wiring 324 penetrating the second insulating interlayer 280 and contacting the second plug 630 may be formed.

The method of manufacturing the semiconductor device illustrated with reference to FIGS. 22 to 25 and 21 like that illustrated with reference to FIGS. 3 to 10 and 1, after forming the fifth via structure 675, the second insulating interlayer 280 and the wirings 322 and 324 may be formed, and the first substrate 100 may be stressed due to a high temperature heat treatment in the formation thereof, and the exfoliation may occur in the fifth via structure 675. However, in accordance with various embodiments, the first stress relief layer 156 may partially surround the fifth via structure 675, and thus the above problems may be reduced.

Figure 26:
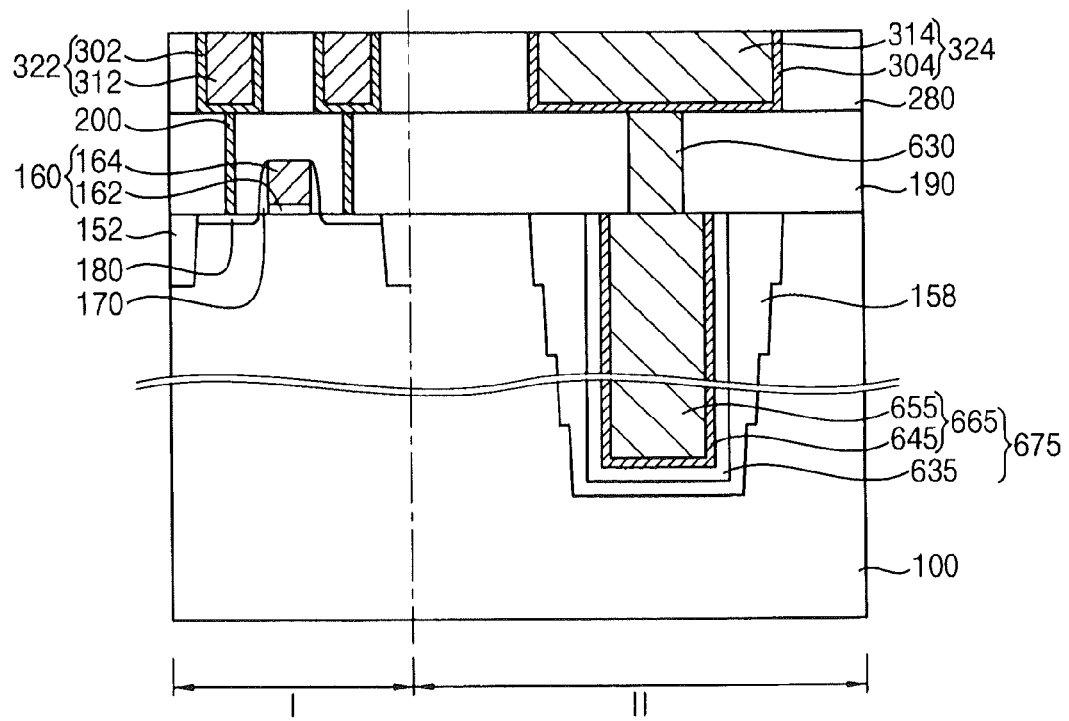
FIG. 26 is a cross-sectional view illustrating a semiconductor device in accordance with various embodiments.

FIG. 26 is a cross-sectional view illustrating a semiconductor device in accordance with various embodiments. The semiconductor device of FIG. 26 may be the same as or similar to that of FIG. 22 except for the shape of the stress relief layer. Thus, like reference numerals refer to like elements, and detailed descriptions thereon are omitted herein.

Referring to FIG. 26, the semiconductor device may include a second stress relief layer 158.

In various embodiments, the second stress relief layer 158 may surround a sidewall and a bottom of the fifth via structure 675. However, the second stress relief layer 158 may not enclose the bottom of the fifth via structure 675.

In various embodiments, the second stress relief layer 158 may have a stepped cross section having a width that may decrease from a top portion to a bottom portion thereof, e.g., with a depth of the second stress relief layer 158. The number of the step may not be limited.

Figure 27:
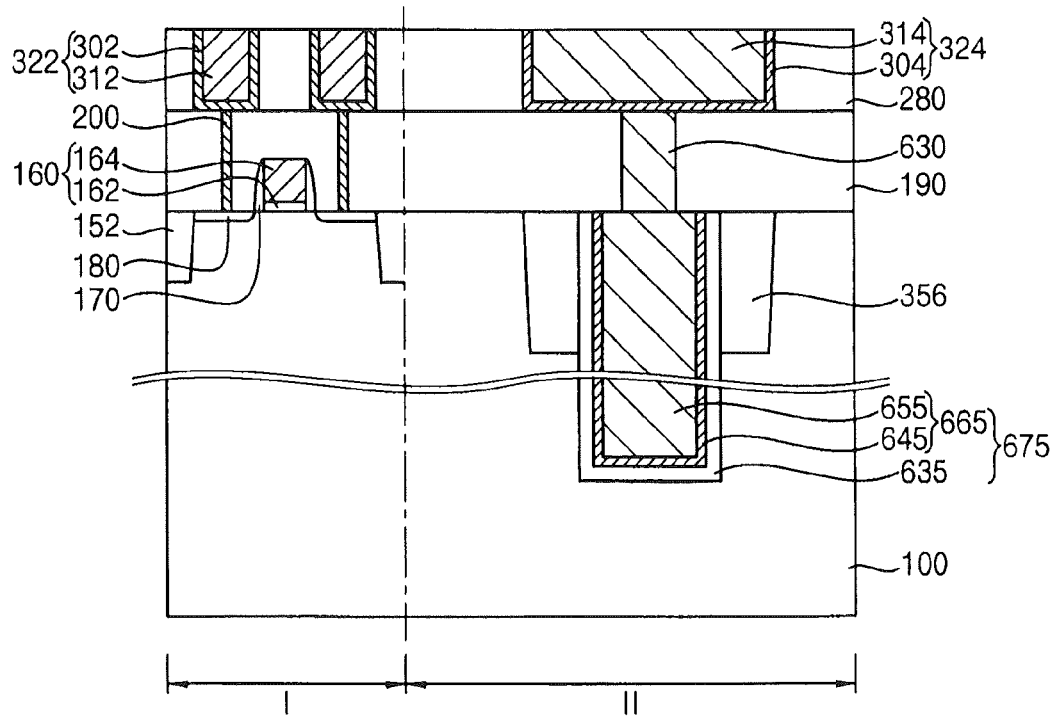
FIG. 27 is a cross-sectional view illustrating a semiconductor device in accordance with various embodiments.

FIG. 27 is a cross-sectional view illustrating a semiconductor device in accordance with various embodiments. The semiconductor device of FIG. 27 may be the same as or similar to that of FIG. 22 except for the shape of the stress relief layer. Thus, like reference numerals refer to like elements, and detailed descriptions thereon are omitted herein.

Referring to FIG. 27, the semiconductor device may include a third stress relief layer 356.

In various embodiments, the third stress relief layer 356 may surround an upper sidewall of a fifth via structure 675.

In various embodiments, the third stress relief layer 356 may include a sidewall having a cross-section of a straight line, and may have a width greater than that of an isolation layer 152. In an example embodiment, the third stress relief layer 356 may have a width more than 2 times of that of the isolation layer 152.

Figure 28:
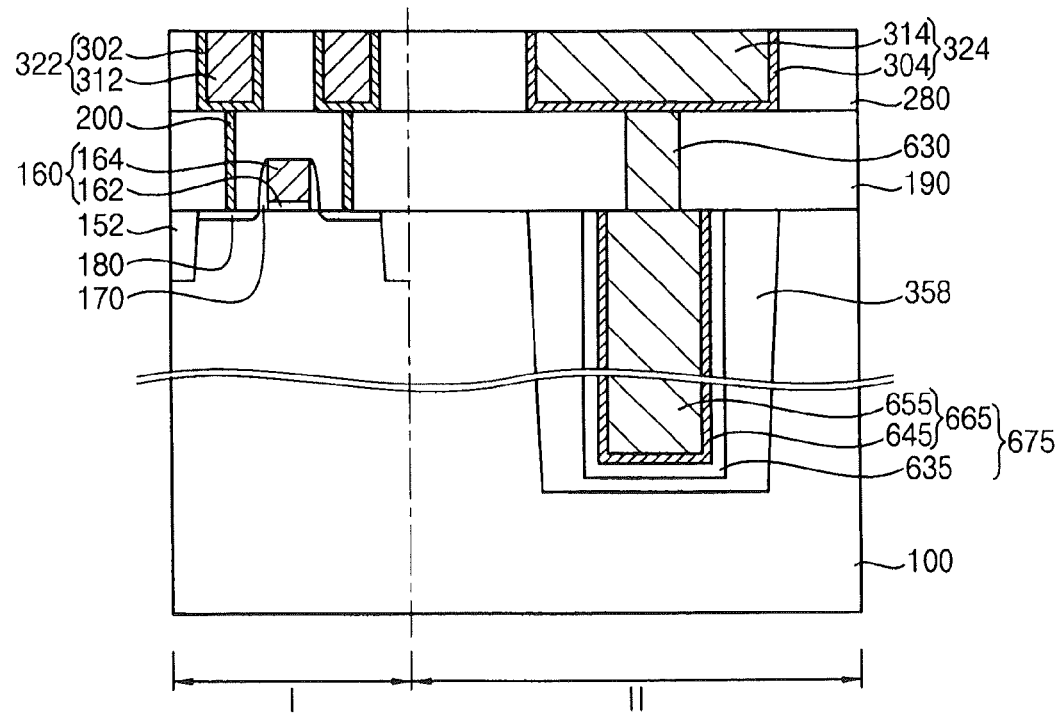
FIG. 28 is a cross-sectional view illustrating a semiconductor device in accordance with various embodiments.

FIG. 28 is a cross-sectional view illustrating a semiconductor device in accordance with various embodiments. The semiconductor device of FIG. 28 may be the same as or similar to that of FIG. 27 except for the shape of the stress relief layer. Thus, like reference numerals refer to like elements, and detailed descriptions thereon are omitted herein.

Referring to FIG. 28, the semiconductor device may include a fourth stress relief layer 358.

In various embodiments, the fourth stress relief layer 358 may enclose a fifth via structure 675. That is, a sidewall and a bottom of the fifth via structure 675 may be enclosed by the fourth stress relief layer 358. However, the fourth stress relief layer 358 may not enclose the bottom of the fifth via structure 675.

Figure 29:
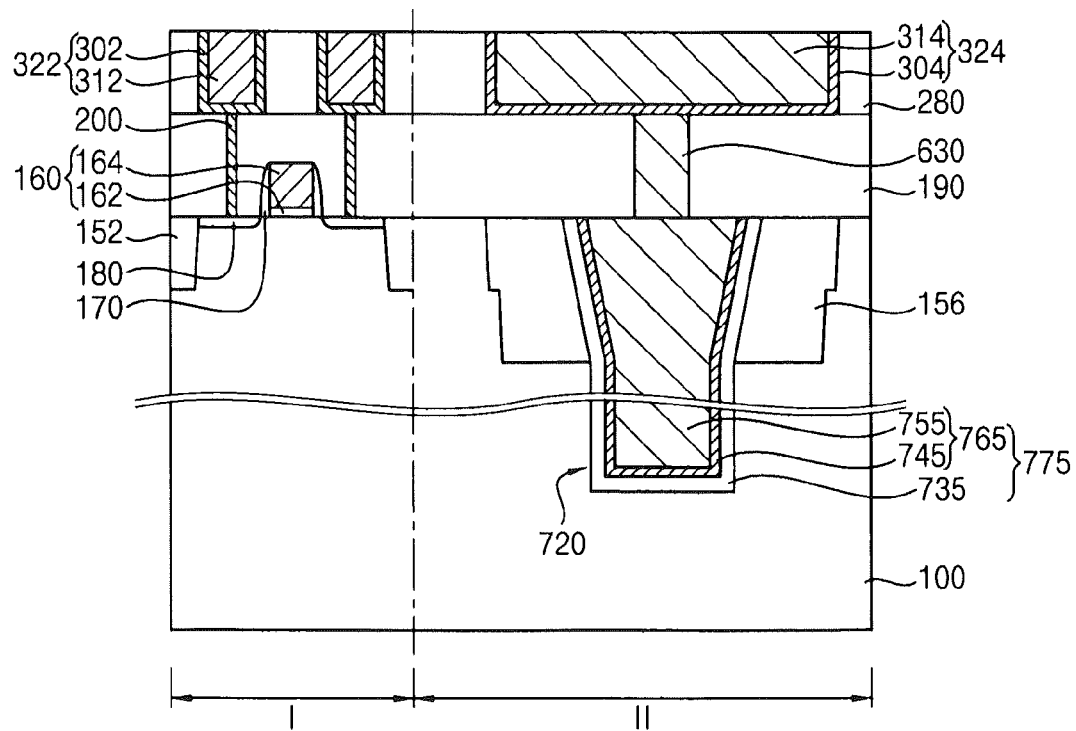
FIG. 29 is a cross-sectional view illustrating a semiconductor device in accordance with various embodiments.

FIG. 29 is a cross-sectional view illustrating a semiconductor device in accordance with various embodiments. The semiconductor device of FIG. 29 may be the same as or similar to that of FIG. 22 except for the shape of the via structure. Thus, like reference numerals refer to like elements, and detailed descriptions thereon are omitted herein.

Referring to FIG. 29, the semiconductor device may include a sixth via structure 775.

In various embodiments, an upper portion of the sixth via structure 775 may be enclosed by a first stress relief layer 156 and have a width gradually decreasing with a depth of the sixth via structure 775, and a lower portion of the sixth via structure 775 may be enclosed by the first substrate 100 and have a constant width along the direction toward the inside of the first substrate 100. That is, the upper portion of the sixth via structure 775 may have a sidewall that may not be perpendicular to a top surface of the first substrate 100 but slanted thereto, and the lower portion of the sixth via structure 775 may have a sidewall perpendicular to the top surface of the first substrate 100.

The sixth via structure 775 may have a sixth insulation layer pattern 735, an eighth barrier layer pattern 745 and a seventh metal layer pattern 755 sequentially stacked. The sixth insulation layer pattern 735 may be conformally formed on an inner wall of a fifth recess 720 through the first stress relief layer 156 and a portion of the first substrate 100, the eighth barrier layer pattern 745 may be conformally formed on the sixth insulation layer pattern 735, and the seventh metal layer pattern 755 may fill a remaining portion of the fifth recess 720 on the eighth barrier layer pattern 745. Thus, a bottom and a sidewall of a sixth via electrode 765 including the seventh metal layer pattern 755 and the eighth barrier layer pattern 745 may be enclosed by the sixth insulation layer pattern 735.

The sixth via structure 775 may have a sidewall that may not be perpendicular to a top surface of the first substrate 100 but slanted thereto, and thus the exfoliation therein, i.e., the exfoliation between the eighth barrier layer pattern 745 and the seventh metal layer pattern 755 or between the eighth barrier layer pattern 745 and the sixth insulation layer pattern 735 may be reduced.

Figure 30:
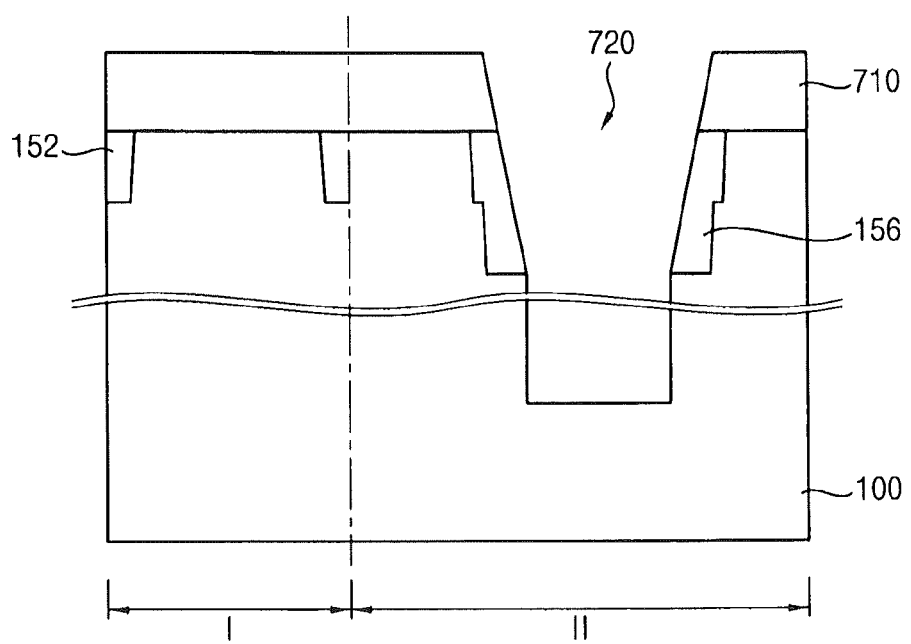
FIGS. 30 to 31 are cross-sectional views illustrating a method of manufacturing a semiconductor device in accordance with various embodiments.
Figure 31:
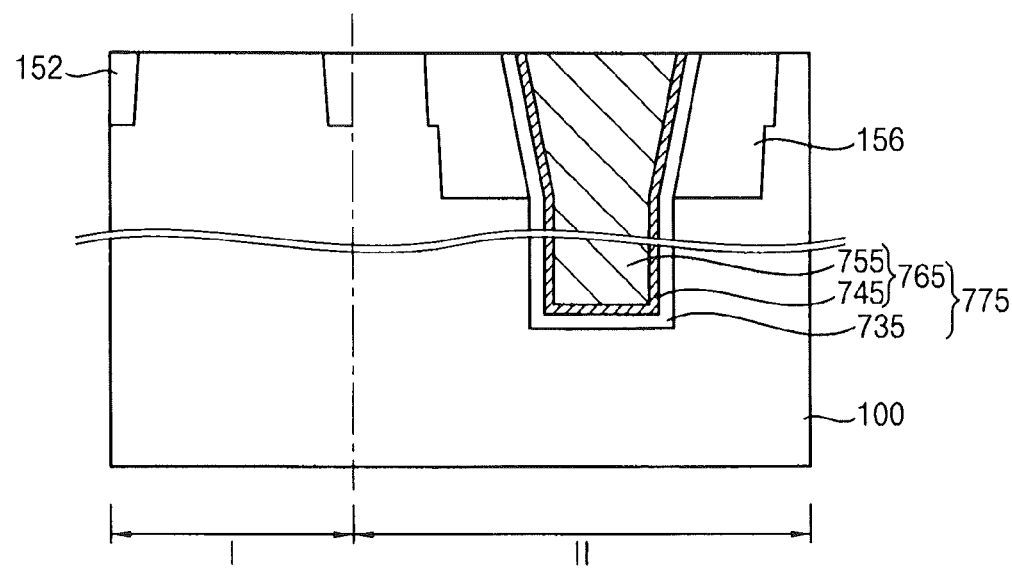

FIGS. 30 to 31 are cross-sectional views illustrating a method of manufacturing a semiconductor device in accordance with various embodiments. This method may be used in manufacturing the semiconductor device of FIG. 29, however, may not be limited thereto.

Processes the same as or similar to those illustrated with reference to FIGS. 3 to 5 may be performed.

Referring to FIG. 30, after forming a eleventh photoresist pattern 710 on a first substrate 100, an isolation layer 152 and a first stress relief layer 156, the stress relief layer 156 and a portion of the first substrate 100 may be etched using the eleventh photoresist pattern 710 as an etching mask to form a fifth recess 720.

In various embodiments, the eleventh photoresist pattern 710 may have a sidewall that may not be perpendicular to a top surface of the first substrate 100 but slanted thereto, and thus an upper portion of the fifth recess 720, i.e., a portion of the fifth recess 720 through the first stress relief layer 156 may have a slanted sidewall. A lower portion of the fifth recess 720, i.e., a portion of the fifth recess 720 through the first substrate 100 including not an oxide but a semiconductor material such as silicon may have a sidewall perpendicular to the top surface of the first substrate 100.

Referring to FIG. 31, after removing the eleventh photoresist pattern 710, processes the same as or similar to those illustrated with reference to FIGS. 8 to 9 may be performed to form a sixth via structure 775 filling the fifth recess 720. The sixth via structure 775 may include a sixth insulation layer pattern 735 conformally formed on an inner wall of the fifth recess 720, an eighth barrier layer pattern 745 conformally formed on the sixth insulation layer pattern 735, and a seventh metal layer pattern 755 filling a remaining portion of the fifth recess 720. The seventh metal layer pattern 755 and the eighth barrier layer pattern 745 may form a sixth via electrode 765.

Referring to FIG. 29 again, processes the same as or similar to those illustrated with reference to FIGS. 10 and 11 may be performed to manufacture the semiconductor device.

Figure 32:
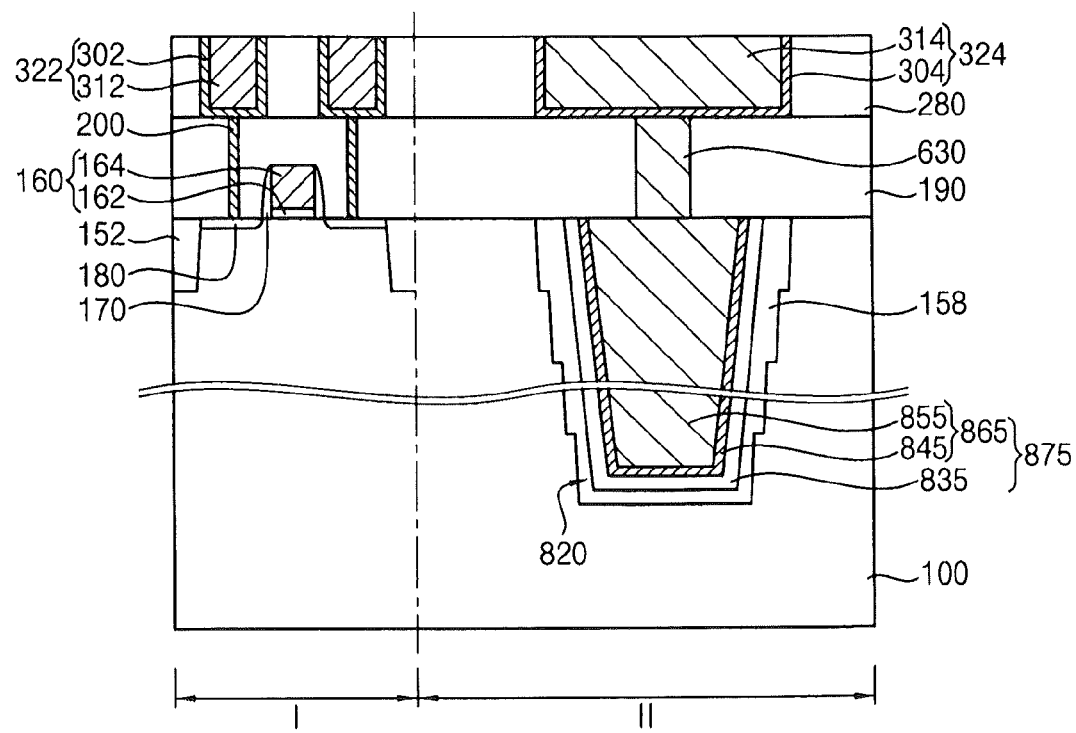
FIG. 32 is a cross-sectional view illustrating a semiconductor device in accordance with various embodiments.

FIG. 32 is a cross-sectional view illustrating a semiconductor device in accordance with various embodiments. The semiconductor device of FIG. 32 may be the same as or similar to that of FIG. 26 except for the shape of the via structure. Thus, like reference numerals refer to like elements, and detailed descriptions thereon are omitted herein.

Referring to FIG. 32, the semiconductor device may include a second stress relief layer 158 and a seventh via structure 875.

In various embodiments, the second stress relief layer 158 may enclose the seventh via structure 875. That is, a bottom and a sidewall of the seventh via structure 875 may be enclosed by the second stress relief layer 158. However, the second stress relief layer 158 may not enclose the bottom of the seventh via structure 875. In various embodiments, the second stress relief layer 158 may have a stepped cross section having a width that may decrease from a top portion to a bottom portion thereof, e.g., with a depth of the second stress relief layer 158, and the number of the step may not be limited.

In various embodiments, the seventh via structure 875 may have a width gradually decreasing from a top portion to a bottom portion thereof. Thus, the seventh via structure 875 may have the sidewall of which a cross-section may be a straight line, however, the sidewall may not be perpendicular to a top surface of the first substrate 100 but slanted thereto unlike the fifth via structure 675 in FIG. 26. Additionally, the seventh via structure 875 may have a sidewall that may be slanted to the top surface of the first substrate 100 at all positions thereof unlike the sixth via structure 775 in FIG. 29.

The seventh via structure 875 may have a seventh insulation layer pattern 835 conformally formed on a sixth recess 820 through a portion or the whole portion of the second stress relief layer 158, a ninth barrier layer pattern 845 conformally formed on the seventh insulation layer pattern 835, and an eighth metal layer pattern 855 filling a remaining portion of the sixth recess 820 on the ninth barrier layer pattern 845. The eighth metal layer pattern 855 and the ninth barrier layer pattern 845 may form a seventh via electrode 865.

Figure 33:
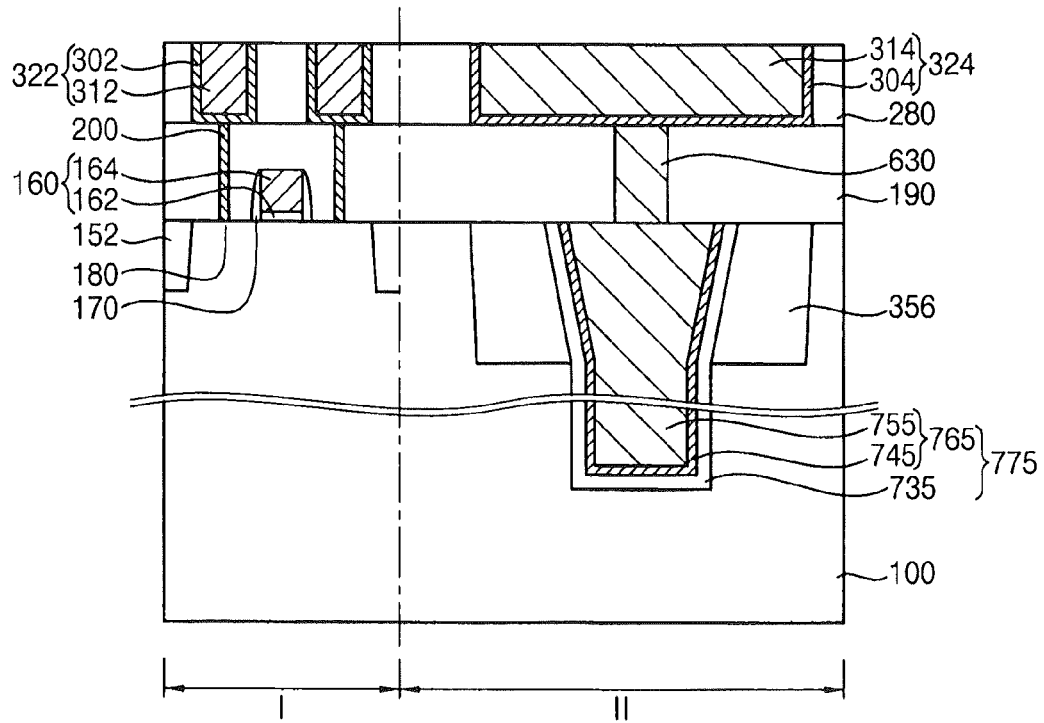
FIG. 33 is a cross-sectional view illustrating a semiconductor device in accordance with various embodiments.

FIG. 33 is a cross-sectional view illustrating a semiconductor device in accordance with various embodiments. The semiconductor device of FIG. 33 may be the same as or similar to that of FIG. 29 except for the shape of the stress relief layer. Thus, like reference numerals refer to like elements, and detailed descriptions thereon are omitted herein.

Referring to FIG. 33, the semiconductor device may include a third stress relief layer 356. In various embodiments, the third stress relief layer 356 may enclose an upper sidewall of a sixth via structure 775.

In various embodiments, the third stress relief layer 356 may have a sidewall that may not have a stepped cross section but a cross-section of a straight line, and may have a width greater than that of an isolation layer 152. In an example embodiment, the third stress relief layer 356 may have a width equal to or more than about 2 times of that of the isolation layer 152.

Figure 34:
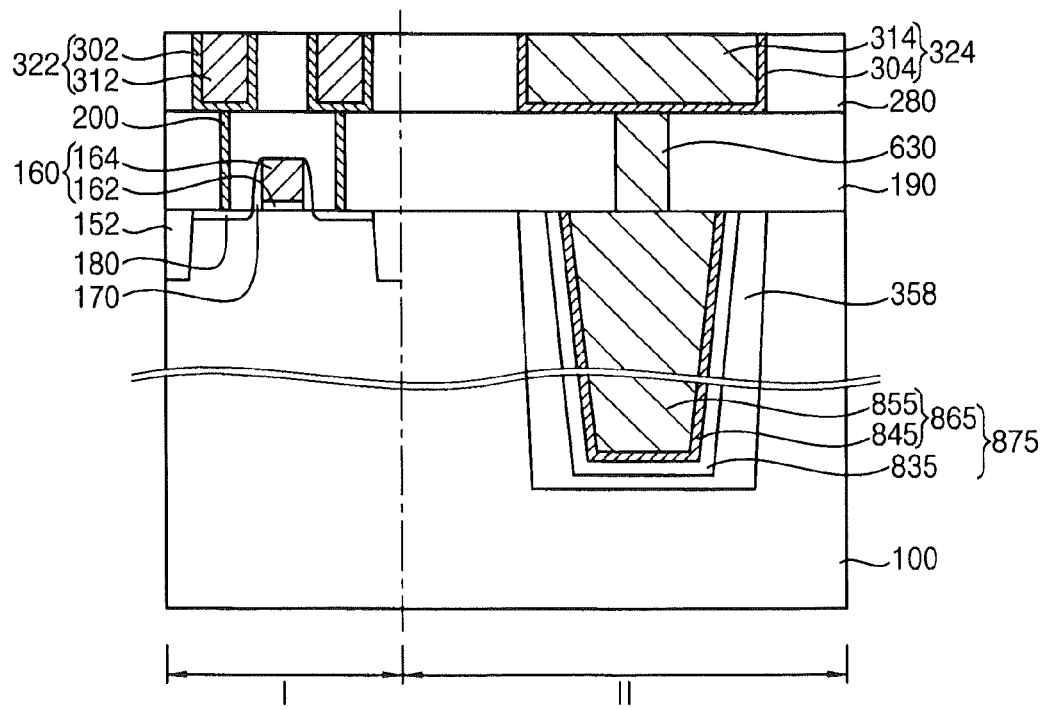
FIG. 34 is a cross-sectional view illustrating a semiconductor device in accordance with various embodiments.

FIG. 34 is a cross-sectional view illustrating a semiconductor device in accordance with various embodiments. The semiconductor device of FIG. 34 may be the same as or similar to that of FIG. 28 except for the shape of the via structure. Thus, like reference numerals refer to like elements, and detailed descriptions thereon are omitted herein.

Referring to FIG. 34, the semiconductor device may include a fourth stress relief layer 358 and a seventh via structure 875.

In various embodiments, the fourth stress relief layer 358 may enclose a seventh via structure 875. That is, a bottom and a sidewall of the seventh via structure 875 may be enclosed by the fourth stress relief layer 358. However, the fourth stress relief layer 358 may not enclose the bottom of the seventh via structure 875.

In various embodiments, the seventh via structure 875 may have a width gradually decreasing from a top portion to a bottom portion thereof. Thus, the seventh via structure 875 may have a sidewall that may have a cross section with a straight line sidewall and may be slanted to a top surface of the first substrate 100.

Figure 35:
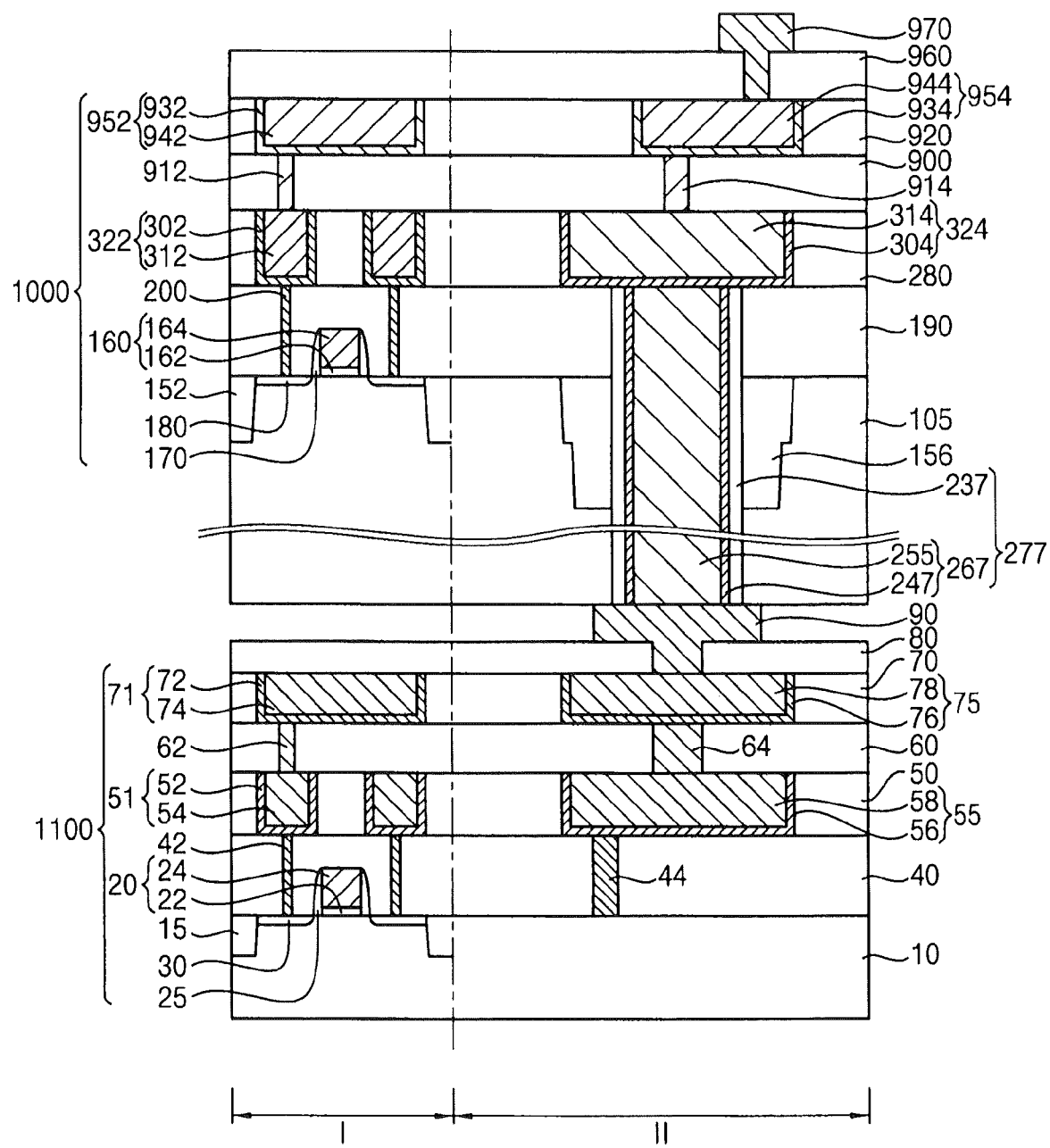
FIG. 35 is a cross-sectional view illustrating a stacked semiconductor device in accordance with various embodiments.

FIG. 35 is a cross-sectional view illustrating a stacked semiconductor device in accordance with various embodiments. The stacked semiconductor device of FIG. 35 may include the semiconductor devices illustrated with reference to FIGS. 1 to 34, and thus, like reference numerals refer to like elements, and detailed descriptions thereon are omitted herein.

Referring to FIG. 35, the stacked semiconductor device may include a first semiconductor chip 1000, a second semiconductor chip 1100 and connection members 90 and 970.

The first semiconductor chip 1000 may include an insulating interlayers 900 and 920, a protection layer 960, wirings 952 and 954 and plugs 912 and 914 in addition to the semiconductor device of FIG. 2. FIG. 35 shows the first semiconductor chip 1000 including the semiconductor device of FIG. 2, however, may also include the semiconductor devices of FIGS. 11 to 34. However, for the electrical connection to the second semiconductor chip 1100, a lower portion of the first substrate may be removed so that the via structures may be exposed.

A third insulating interlayer 900 containing third and fourth plugs 912 and 914 may be formed on a second insulating interlayer 280 containing first and second wirings 322 and 324. The third and fourth plugs 912 and 914 may be electrically connected to the first and second wirings 322 and 324, respectively. In various embodiments, the third and fourth plugs 912 and 914 may include a metal, a metal nitride, doped polysilicon, and the third insulating interlayer 900 may include an oxide.

A fourth insulating interlayer 920 containing third and fourth wirings 952 and 954 may be formed on the third insulating interlayer 900 containing third and fourth plugs 912 and 914. The third and fourth wirings 952 and 954 may be electrically connected to the third and fourth plugs 912 and 914, respectively. In various embodiments, the third wiring 952 may include a tenth barrier layer pattern 932 and a ninth metal layer pattern 942, and the fourth wiring 954 may include an eleventh barrier layer pattern 934 and a tenth metal layer pattern 944. The tenth and eleventh barrier layer patterns 932 and 934 may include a metal or a metal nitride, and the ninth and tenth metal layer patterns 942 and 944 may include a metal.

The protection layer 960 may be formed on the third and fourth wirings 952 and 954 and the fourth insulating interlayer 920. The protection layer 960 may include an insulating material, e.g., polyimide.

FIG. 35 shows first to fourth insulating interlayers 190, 280, 900 and 920 and first to fourth wirings 322, 324, 952 and 954, however, more insulating interlayers and wirings may be formed.

A first connection member 970 may penetrate the protection layer 960 to be electrically connected to the fourth wiring 954. The first connection member 970 may be also formed on the protection layer 960. The first connection member 970 may include a metal, e.g., silver, copper, etc., or an alloy, e.g., solder. The first connection member 970 may be electrically connected to a printed circuit board (PCB) via a bump or a wiring bonding, or electrically connected to other semiconductor chips.

The second semiconductor chip 1100 may include circuit devices and/or wirings, and may be electrically connected to the first semiconductor chip 1000. FIG. 35 shows a semiconductor chip having no via structure, however, the second semiconductor chip 1100 may also include a via structure like the first semiconductor chip 1000.

FIG. 35 shows a transistor serving as the circuit device. The transistor may include a gate structure 20 having a gate insulation layer pattern 22 and a gate electrode 24 sequentially stacked on an active region of a third substrate 10, a gate spacer 25 on a sidewall of the gate structure 20, and impurity regions 30 at upper portions of the third substrate 10 adjacent to the gate structure 20.

A first insulating interlayer 40 covering the transistor may be formed on the third substrate 10. First and second plugs 42 and 44 may be formed through the first insulating interlayer 40. The first plug 42 may be electrically connected to the impurity regions 30.

A second insulating interlayer 50 may be formed on the first and second plugs 42 and 44 and the first insulating interlayer 40. First and second wirings 51 and 55 may be formed through the second insulating interlayer 50 and contact the first and second plugs 42 and 44, respectively. The first wiring 51 may include a first barrier layer pattern 52 and a first metal layer pattern 54, and the second wiring 55 may include a second barrier layer pattern 56 and a second metal layer pattern 58.

A third insulating interlayer 60 may be formed on the first and second wirings 51 and 55 and the second insulating interlayer 50. Third and fourth plugs 62 and 64 may be formed through the third insulating interlayer 60 and contact the first and second wirings 51 and 55, respectively.

A fourth insulating interlayer 70 may be formed on the third and fourth plugs 62 and 64 and the third insulating interlayer 60. Third and fourth wirings 71 and 75 may be formed through the fourth insulating interlayer 70 and contact the third and fourth plugs 62 and 64, respectively. The third wiring 71 may include a third barrier layer pattern 72 and a third metal layer pattern 74, and the fourth wiring 75 may include a fourth barrier layer pattern 76 and a fourth metal layer pattern 78.

FIG. 35 shows first to fourth insulating interlayers 40, 50, 60 and 70 and first to fourth wirings 51, 55, 71 and 75, however, more insulating interlayers and wirings may be formed.

The protection layer 80 may be formed on the third and fourth wirings 71 and 75 and the fourth insulating interlayer 70.

A second connection member 90 may penetrate the protection layer 80 and may be formed on a portion of a top surface of the protection layer 80. The second connection member 90 may include a metal, e.g., silver, copper, etc., or an ally, e.g., solder. The first and second semiconductor chips 1000 and 1100 may be electrically connected to each other.

Figure 36:
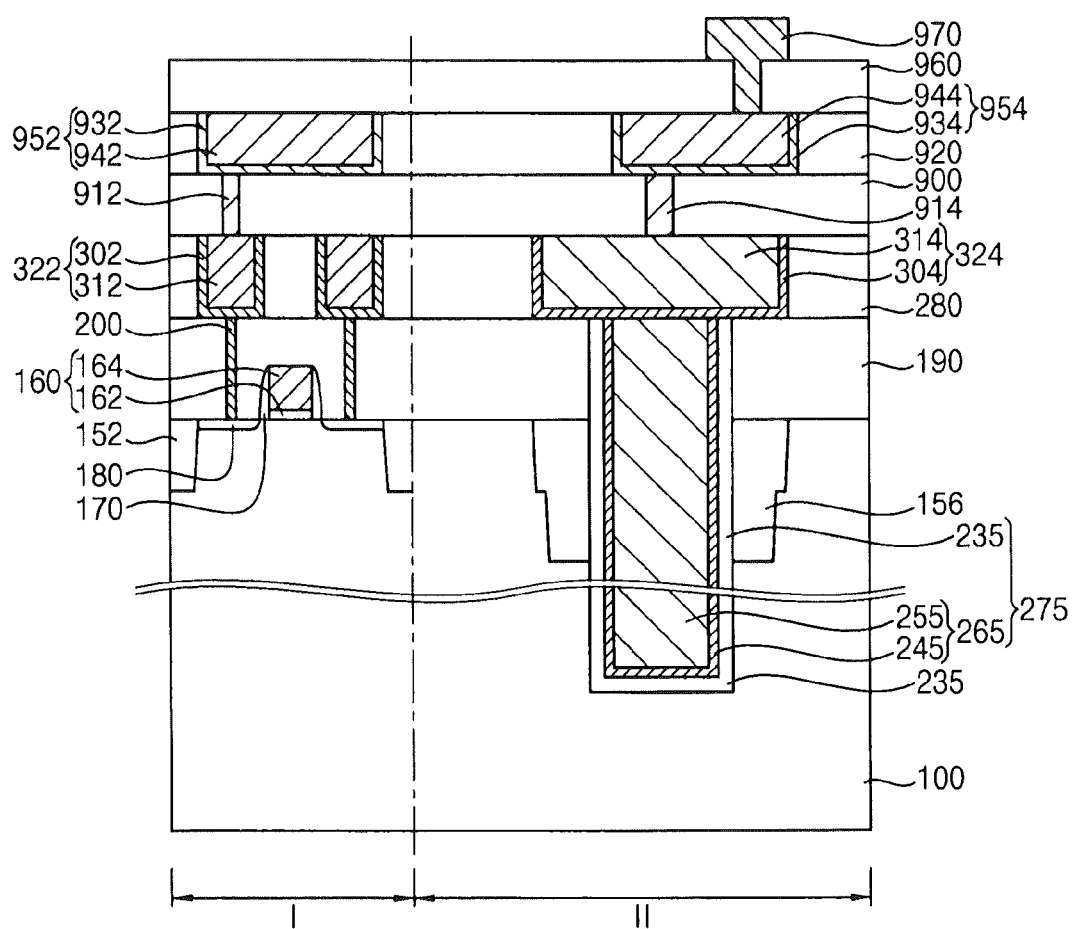
FIGS. 36 and 37 are cross-sectional views illustrating a method of manufacturing a stacked semiconductor device in accordance with various embodiments.
Figure 37:
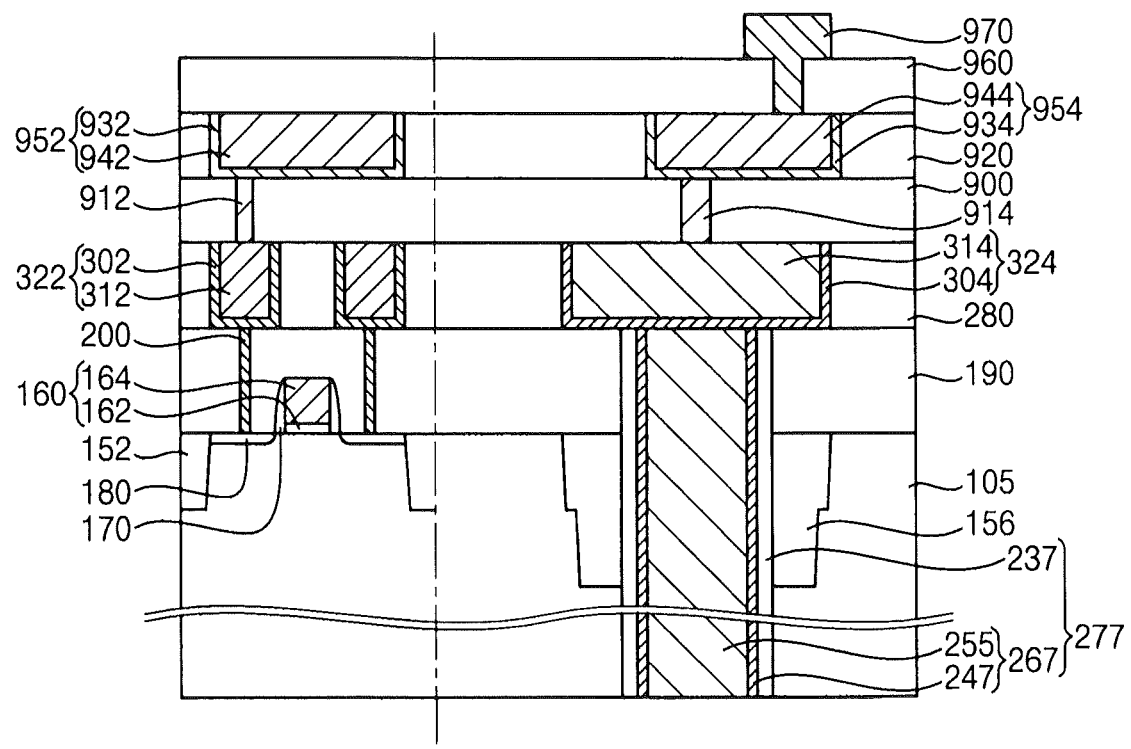

FIGS. 36 and 37 are cross-sectional views illustrating a method of manufacturing a stacked semiconductor device in accordance with various embodiments.

First, the semiconductor device of FIG. 1 may be manufactured.

Referring to FIG. 36, a third insulating interlayer 900 containing third and fourth plugs 912 and 914 may be formed on a second insulating interlayer 280 containing first and second wirings 322 and 324. The third and fourth plugs 912 and 914 may be formed to contact the first and second plugs 322 and 324.

A fourth insulating interlayer 920 containing third and fourth wirings 952 and 954 may be formed on the third insulating interlayer 900 and the third and fourth plugs 912 and 914. The third and fourth wirings 952 and 954 may be formed to contact the third and fourth plugs 912 and 914, respectively. In various embodiments, the third wiring 952 may be formed to include a tenth barrier layer pattern 932 and a ninth metal layer pattern 942, and the fourth wiring 954 may be formed to contact an eleventh barrier layer pattern 934 and a tenth metal layer pattern 944.

A protection layer 960 may be formed on the third and fourth wirings 952 and 954 and the fourth insulating interlayer 920. The protection layer 960 may be formed to include an insulating material, e.g., polyimide.

A first connection member 970 may be formed through the protection layer 960 to contact the fourth wiring 954. The first connection member 970 may be formed to include a metal, e.g., silver, copper, etc., or an alloy, e.g. solder.

Referring to FIG. 37, a lower portion of the first substrate 100 may be removed to expose the first via structure 275. In various embodiments, the lower portion of the first substrate 100 may be removed by a chemical mechanical polishing (CMP) process.

A lower portion of the first insulation layer pattern 235 of the first via structure 275 may be also removed. Thus, the first insulation layer pattern 235 may be transformed into a second insulation layer pattern 237, and the first via structure 275 may be transformed into a second via structure 277. The first substrate 100 may be transformed into a second substrate 105 having a thickness less than that of the first substrate 100.

Referring to FIG. 35 again, the first and second semiconductor chips 1000 and 1100 may be electrically connected to each other by a second connection member 90 to manufacture the stacked semiconductor device.

Figure 38:
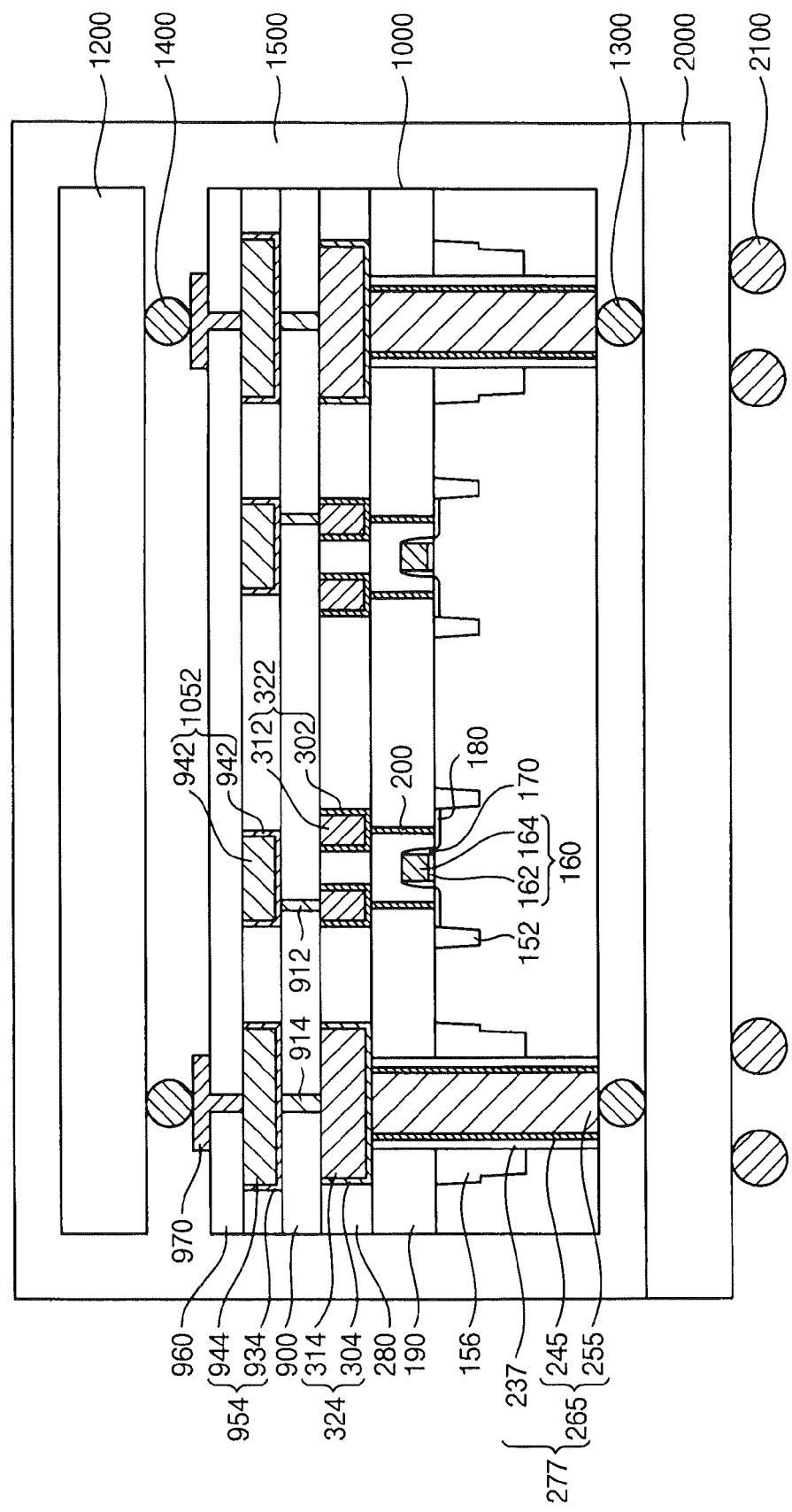
FIG. 38 is a cross-sectional view illustrating a semiconductor package in accordance with various embodiments.

FIG. 38 is a cross-sectional view illustrating a semiconductor package in accordance with various embodiments. FIG. 38 shows a flip chip package, however, other types of semiconductor packages may be also manufactured.

Referring to FIG. 38, the semiconductor package may include a first semiconductor chip 1000 and a third semiconductor chip 1200 sequentially stacked on a package substrate 2000. The semiconductor package may further include first and second conductive bumps 1300 and 1400, a molding member 1500 and an external connection terminal 2100.

The package substrate 2000 may be, e.g., a printed circuit board (PCB) in which circuit patterns are printed.

The first semiconductor chip 1000 may be the first semiconductor chip of the stacked semiconductor device of FIG. 35. The first semiconductor chip 1000 may be mounted on the package substrate 2000, and may be electrically connected to the package substrate 1000 via the first conductive bump 1300. The first conductive bump 1300 may include a metal, e.g., silver, copper, etc., or an alloy, e.g., solder.

The third semiconductor chip 1200 may be the same as or similar to the first semiconductor chip 1000 or the second semiconductor chip 1100 of FIG. 35, however, may not be limited thereto. The third semiconductor chip 1200 may be electrically connected to the first semiconductor chip 1200 via the second conductive bump 1400 making contact with the first connection member 970 on the first semiconductor chip 1000.

The molding member 1500 covering the first and third semiconductor chips 1000 and 1200, the first and second conductive bumps 1300 and 1400, and the first connection member 970 may be formed on the package substrate 2000. The molding member 1500 may prevent the semiconductor chips 1000 and 1200 from being corroded so that the semiconductor chips 1000 and 1200 may not be deteriorated and that the mechanical stability thereof may be enhanced. In various embodiments, the molding member 1500 may include epoxy molding compound (EMC).

The external connection terminal 2100 may be formed on a bottom surface of the package substrate 2000. The semiconductor package may be mounted on a module substrate via the external connection terminal 2100 to form, e.g., a memory module.

The semiconductor package may include the first semiconductor chip 1000 having the first stress relief layer 156 in accordance with various embodiments, and thus a stress onto the second substrate 105 by the second via structure 277 may be reduced and the exfoliation in the second via structure 277 may be reduced. Thus, the first semiconductor chip 1000 may have good operation characteristics and reliability. Accordingly, the semiconductor package may have good electrically characteristics.

FIG. 38 shows the first semiconductor chip includes the semiconductor device of FIG. 2, however, may also include the semiconductor devices of FIGS. 11 to 34.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device, comprising:
   a substrate including a circuit region and a via region;
   an isolation layer on the circuit region of the substrate, the isolation layer defining an active region;
   a stress relief layer on the via region of the substrate, the stress relief layer having a thickness larger than that of the isolation layer and a stepped cross section; and
   a via structure in the stress relief layer and the substrate, the via structure in the substrate having a portion exposed by the stress relief layer.

2. The semiconductor device of claim 1, wherein the stress relief layer comprises a material identical to that comprising the isolation layer and has a thickness about two times or more than two times larger than that of the isolation layer.

3. The semiconductor device of claim 1, wherein the via structure includes:
   an upper portion being surrounded by the stress relief layer, the upper potion having a width gradually decreasing with a depth of the via structure in the substrate; and
   a lower portion being surrounded by the substrate and having a constant width.

4. The semiconductor device of claim 1, further comprising:
   a circuit device on the circuit region of the substrate; and
   an insulating interlayer on the circuit device, the isolation layer and the stress relief layer.

5. The semiconductor device of claim 4, wherein a portion of the via structure is in the insulating interlayer.

6. The semiconductor device of claim 5, wherein the via structure includes:
   an upper portion being surrounded by the insulating interlayer and the stress relief layer, the upper portion having a width that gradually decreases with a depth of the via structure; and
   a lower portion being surrounded by the substrate and having a constant width.

7. The semiconductor device of claim 1, wherein the via structure is formed in a recess and includes:
   an insulation layer pattern on an inner wall of the recess;
   a barrier layer pattern on the insulation layer pattern; and
   a metal layer pattern on the barrier layer pattern, the metal layer pattern filling a remaining portion of the recess.

8. The semiconductor device of claim 1, wherein the via structure is formed in an opening and includes:
   an insulation layer pattern on a sidewall of the opening;
   a barrier layer pattern on a bottom of the opening exposed to outside of the substrate and on the insulation layer pattern; and
   a metal layer pattern on the barrier layer pattern, the metal layer pattern filling a remaining portion of the opening.

9. The semiconductor device of claim 1, wherein the stress relief layer has a width that decreases with a depth of the stress relief layer in the substrate.

10. A semiconductor device, comprising:
    a substrate including a circuit region and a via region;
    an isolation layer defining an active region on the circuit region;
    a stress relief layer on the via region, wherein the stress relief layer has a thickness greater than that of the isolation layer and has stair stepped sidewalls having at least two steps, wherein a cross section of the stress relief layer has a width that decreases from an upper surface of the substrate; and
    a via structure in the stress relief layer and the substrate.

11. The semiconductor device of claim 10, wherein the via structure in the substrate has a portion exposed by the stress relief layer.

12. The semiconductor device of claim 10, wherein the via structure has a tapered profile in the stress relief layer.

13. The semiconductor device of claim 12, wherein the via structure has straight sidewalls having a vertical profile in which the via structure in the substrate is exposed by the stress relief layer.

14. The semiconductor device of claim 10, wherein a maximum width cross section of the stress relief layer has a thickness identical to that of the isolation layer.

15. The semiconductor device of claim 10, further comprising:
    a circuit device on the circuit region;
    an insulating interlayer on the circuit device, the isolation layer and the stress relief layer, and wherein a portion of the via structure is in the insulating interlayer.

16. The semiconductor device of claim 15, wherein a portion of the via structure in the stress relief layer and the insulating interlayer has a tapered profile with a top portion having a greater width than a lower portion.

* * * * *